United States Patent
Bera et al.

(10) Patent No.: US 8,512,509 B2
(45) Date of Patent: *Aug. 20, 2013

(54) PLASMA REACTOR GAS DISTRIBUTION PLATE WITH RADIALLY DISTRIBUTED PATH SPLITTING MANIFOLD

(75) Inventors: Kallol Bera, San Jose, CA (US); Shahid Rauf, Pleasanton, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1110 days.

This patent is subject to a terminal disclaimer.

(21) Appl. No.: 12/004,444

(22) Filed: Dec. 19, 2007

(65) Prior Publication Data

US 2009/0162260 A1    Jun. 25, 2009

(51) Int. Cl.
*H01L 21/306* (2006.01)

(52) U.S. Cl.
USPC ............... 156/345.34; 156/345.33; 118/715; 422/186.04

(58) Field of Classification Search
USPC ... 156/345.33, 345.34; 118/715; 422/186.04
See application file for complete search history.

(56) References Cited

U.S. PATENT DOCUMENTS

| | | | | |
|---|---|---|---|---|
| 3,531,053 | A | | 9/1970 | Miller et al. ............... 239/553.3 |
| 4,612,077 | A | * | 9/1986 | Tracy et al. .............. 156/345.34 |
| 5,432,315 | A | | 7/1995 | Kaji et al. ................. 219/121.43 |
| 5,453,124 | A | * | 9/1995 | Moslehi et al. ............... 118/715 |
| 5,505,385 | A | | 4/1996 | Gengler ...................... 239/553.3 |
| 5,571,366 | A | | 11/1996 | Ishii et al. ...................... 156/345 |
| 5,622,606 | A | * | 4/1997 | Kugler et al. ............. 204/192.12 |
| 5,704,981 | A | | 1/1998 | Kawakami et al. ........... 118/715 |
| 5,800,621 | A | | 9/1998 | Redeker et al. ............... 118/723 |
| 5,992,453 | A | * | 11/1999 | Zimmer ..................... 137/561 A |
| 6,063,233 | A | | 5/2000 | Collins et al. ................. 156/345 |
| 6,113,700 | A | | 9/2000 | Choi ............................. 118/715 |
| 6,143,077 | A | | 11/2000 | Ikeda et al. ................... 118/715 |
| 6,173,673 | B1 | | 1/2001 | Golovato et al. ............. 118/723 |
| 6,206,972 | B1 | | 3/2001 | Dunham ....................... 118/715 |
| 6,388,382 | B1 | | 5/2002 | Doi et al. ................. 315/111.51 |
| 6,586,886 | B1 | * | 7/2003 | Katz et al. ................ 315/111.21 |
| 6,589,437 | B1 | | 7/2003 | Collins ........................... 216/68 |
| 6,727,654 | B2 | | 4/2004 | Ogawa et al. ............ 315/111.01 |
| 6,881,295 | B2 | | 4/2005 | Nagakura ................ 156/345.33 |
| 7,077,911 | B2 | | 7/2006 | Kijima et al. ................. 118/715 |
| 2004/0050325 | A1 | * | 3/2004 | Samoilov et al. ............. 118/715 |
| 2004/0099378 | A1 | * | 5/2004 | Kim et al. ................ 156/345.33 |

(Continued)

FOREIGN PATENT DOCUMENTS

KR   10-2006-0042164   5/2006

OTHER PUBLICATIONS

U.S. Appl. No. 11/693,089, filed Mar. 29, 2007, Paterson et al.
U.S. Appl. No. 11/679,122, filed Feb. 26, 2007, Paterson et al.

(Continued)

*Primary Examiner* — Jeffrie R Lund
*Assistant Examiner* — Satish Chandra
(74) *Attorney, Agent, or Firm* — Robert M. Wallace

(57) ABSTRACT

In a showerhead assembly, a path splitting manifold comprises a gas supply inlet and a planar floor and plural gas outlets extending axially through the floor and azimuthally distributed about the floor. The path splitting manifold further comprises a plurality of channels comprising plural paths between the inlet and respective ones of the plural outlets. A gas distribution showerhead underlies the floor of the manifold and is open to the plural outlets. In certain embodiments, the plural paths are of equal lengths.

14 Claims, 24 Drawing Sheets

(56) References Cited

U.S. PATENT DOCUMENTS

| | | | |
|---|---|---|---|
| 2004/0112540 A1 | 6/2004 | Larson et al. | 156/345.33 |
| 2004/0134611 A1* | 7/2004 | Kato et al. | 156/345.33 |
| 2005/0022933 A1 | 2/2005 | Howard | 156/345.47 |
| 2005/0082256 A1 | 4/2005 | Honda et al. | 216/67 |
| 2005/0103265 A1* | 5/2005 | Gianoulakis et al. | 118/715 |
| 2005/0150459 A1 | 7/2005 | Shang et al. | 118/723 |
| 2005/0178748 A1 | 8/2005 | Buchberger et al. | 219/121.48 |
| 2005/0183826 A1 | 8/2005 | Choi et al. | 156/345.34 |
| 2005/0205013 A1 | 9/2005 | Nakanishi et al. | 118/723 |
| 2006/0169671 A1 | 8/2006 | Miya et al. | 216/67 |
| 2006/0191637 A1* | 8/2006 | Zajac et al. | 156/345.34 |

OTHER PUBLICATIONS

U.S. Appl. No. 12/004,472, filed Dec. 19, 2007, Bera et al.
U.S. Appl. No. 12/004,524, filed Dec. 19, 2007, Bera et al.
U.S. Appl. No. 12/004,448, filed Dec. 19, 2007, Bera et al.
U.S. Appl. No. 12/004,499, filed Dec. 19, 2007, Bera et al.
Official Action Dated Oct. 1, 2010 Issued in Co-Pending U.S. Appl. No. 11/693,089.

* cited by examiner

PLASMA REACTOR GAS DISTRIBUTION PLATE WITH RADIALLY DISTRIBUTED PATH SPLITTING MANIFOLD

CROSS-REFERENCE TO RELATED APPLICATIONS

This application contains subject matter related to U.S. patent application Ser. No. 11/693,089, filed Mar. 29, 2007 by Alexander Paterson et al. entitled "Plasma Reactor With An Overhead Inductive Antenna And An Overhead Gas Distribution Showerhead" and assigned to the present assignee, the disclosure of which is incorporated herein in its entirety.

TECHNICAL FIELD

This application concerns a plasma reactor for processing a workpiece such as a semiconductor wafer, and in particular a gas distribution plate for such a reactor.

BACKGROUND

A gas distribution showerhead is located at the reactor chamber ceiling overlying the workpiece or semiconductor wafer. One conventional showerhead has an annular plenum in which gas is introduced at one end and circulates azimuthally around the annular plenum. The gas injection orifices of the showerhead are azimuthally distributed outlets in the floor of the plenum. One problem with such a showerhead is that gas distribution is azimuthally non-uniform because the gas pressure is not uniform along the azimuthally flow path through the plenum. Another problem is that during some process transitions, such as a transition from an Argon process gas to an Oxygen process gas, some arcing (plasma light-up) in the gas outlets occurs. This is due at least in part to the non-uniform distribution of Argon and Oxygen in the plenum during the transition. During the transition, Oxygen predominates in the region nearest the gas supply and Argon predominates in the region furthest from the gas supply.

The plasma below the showerhead has a corresponding non-uniform distribution of Oxygen and Argon. Plasma density becomes correspondingly non-uniform because the portion of the plasma containing more Argon absorbs more plasma source power. Moreover, the sheath thickness of the portion of the plasma containing more Argon is less than the portion containing predominantly Oxygen. This leads to light-up or arcing in the showerhead outlets overlying the region of the plasma containing more Argon than Oxygen. This condition may last until all the Argon has been displaced by the incoming Oxygen gas, which may take on the order of a few seconds.

There is a need to introduce process gas in a manner that avoids such non-uniform distribution of gases during a process transition from one process gas to a different process gas.

SUMMARY

In one embodiment, a gas distribution showerhead assembly is provided for use in a plasma reactor adapted to process a workpiece or semiconductor wafer. In one embodiment, the showerhead assembly includes a path splitting manifold that includes a gas supply inlet and a planar floor and plural gas outlets extending axially through the floor and azimuthally distributed about the floor. The path splitting manifold further includes a plurality of channels comprising plural paths of equal lengths between the inlet and respective ones of the plural outlets. A showerhead of the showerhead assembly underlies the floor of the manifold and is open to the plural outlets. The showerhead includes a showerhead floor and a plurality of gas injection holes extending axially through the showerhead floor. The assembly further includes an electrode underlying the floor of the showerhead, the electrode having plural axial holes in registration with the gas injection holes of the showerhead.

BRIEF DESCRIPTION OF THE DRAWINGS

So that the manner in which the above recited embodiments of the invention are attained and can be understood in detail, a more particular description of the invention, briefly summarized above, may be had by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. The drawings in the figures are all schematic and not to scale.

DETAILED DESCRIPTION

Figure 1:
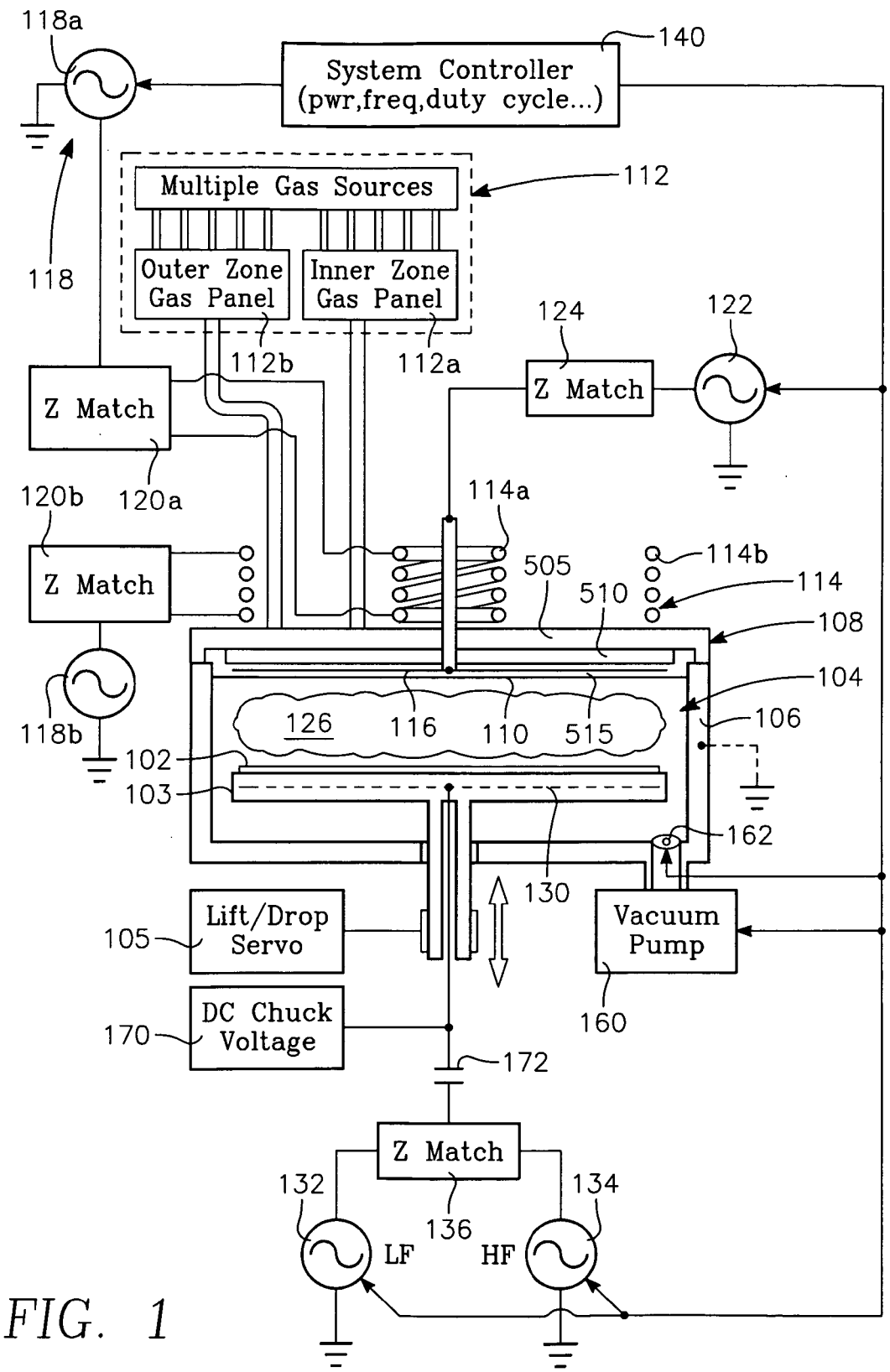
FIG. 1 is a simplified block diagram including a cut-away side view of a plasma reactor in accordance with one embodiment.

Referring to FIG. 1, a workpiece 102, which may be a semiconductor wafer, is held on a workpiece support 103 within a reactor chamber 104. Optionally, the workpiece support 103 may be raised and lowered by a lift servo 105. The chamber 104 is bounded by a chamber sidewall 106 and a ceiling 108. In one embodiment, the ceiling 108 is a gas distribution showerhead assembly including a lid 505 (FIG. 2), a manifold 510 (FIGS. 3A and 3B) and a showerhead 515 (FIG. 4). As indicated in FIG. 1, the lid 505 rests on top of the manifold 510 and the manifold 510 rests on top of the showerhead 515. The showerhead 515 has small gas injection orifices 110 extending through it, as illustrated in FIG. 4. Referring again to FIG. 1, the gas distribution showerhead assembly 108 receives process gas from a process gas supply 112. A capacitively coupled RF plasma source power applicator consists of an electrode 116 in the ceiling 108.

Many embodiments described herein concern primarily a capacitively coupled plasma reactor for dielectric etch processes (for example), in which there is no inductively coupled power applicator. However, in embodiments for other process applications, such as polysilicon etch processes or metal etch processes, an inductively coupled power applicator, such as an overhead coil antenna 114 depicted in FIG. 1, may be provided. In such an embodiment, in order to permit inductive coupling into the chamber 104 from the overhead coil antenna 114, the ceiling 108 may be formed of a dielectric material such as a ceramic, and the ceiling electrode 116 may have multiple radial slots. The coil antenna 114 is driven by an RF generator 118. In one embodiment, the coil antenna 114 may consist of inner and outer conductor windings 114a, 114b while the generator 118 may be respective RF generators 118a, 118b coupled through respective impedance matches 120a, 120b to the inner and outer coil antennas 114a, 114b. However, it is understood that the coil antennas 114 (114a and 114b) may be eliminated in embodiments for other uses, such as dielectric etch, in which case the electrode 116 may be unslotted and the ceiling 108 may be formed of metal.

In one embodiment, an RF power generator 122 provides high frequency (HF) or very high frequency (VHF) power (e.g., within a range of about 27 MHz through 200 MHz) through an impedance match element 124 to the overhead electrode 116. Power is coupled to a bulk plasma 126 within the chamber 104 formed over the workpiece support 103.

RF plasma bias power is coupled to the workpiece 102 from an RF bias power supply coupled to an electrode 130 underlying the wafer 102. In one embodiment, the RF bias power supply may include a low frequency (LF) RF power generator 132 (100 kHz to 4 MHz) and another RF power generator 134 that may be a high frequency (HF) RF power generator (4 MHz to 27 MHz). An impedance match element 136 is coupled between the bias power generators 132, 134 and the workpiece support electrode 130. A vacuum pump 160 evacuates process gas from the chamber 104 through a valve 162 which can be used to regulate the evacuation rate. If the workpiece support 103 is an electrostatic chuck, then a D.C. chucking voltage supply 170 is connected to the electrode 130. A capacitor 172 provides isolation from the D.C. voltage supply 170.

In one embodiment, a system controller 140 may control the source power generators 118, 122. The controller 140 may also control the pumping rate of the vacuum pump 160 and/or the opening size of the evacuation valve 162. In addition, the controller 140 may control the bias power generators 132, 134.

Figure 2:
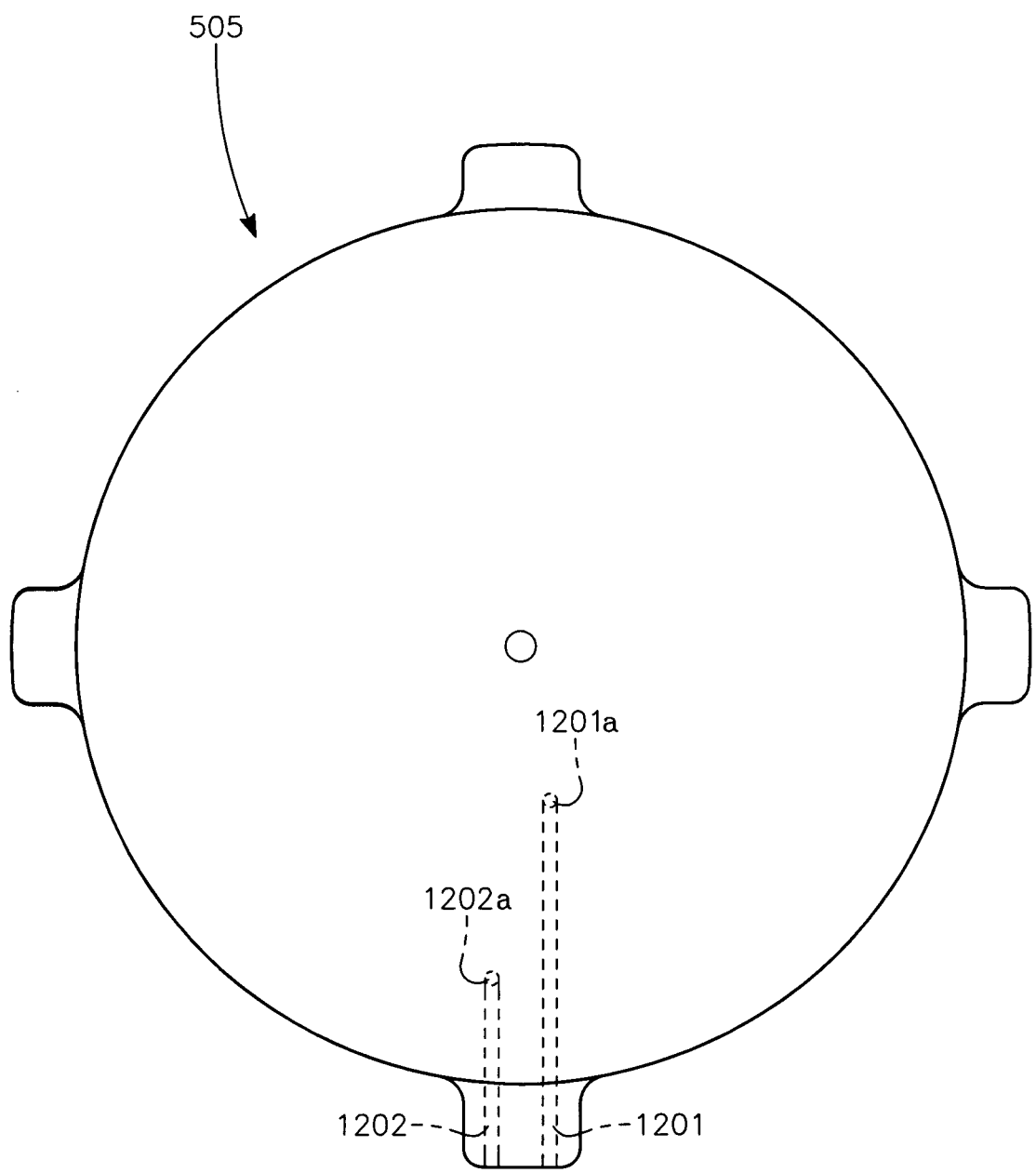
FIG. 2 is a top view of a ceiling lid of the gas distribution plate of the reactor of FIG. 1.

The lid 505 in one embodiment is depicted in FIG. 2, and may be a disk composed of metal or insulating material. The lid 505 has elongate radial inner and outer zone gas supply passages 1201, 1202 extending inwardly from the outer edge of the lid 505. Inner zone and outer zone gas panels 112a, 112b of the gas supply 112 (FIG. 1) furnish process gas to respective ones of the gas supply passages 1201, 1202. The gas panels 112a, 112b control process gas flow rates from individual ones of plural (multiple) process gas sources containing different process gas species or compounds.

Figure 3A:
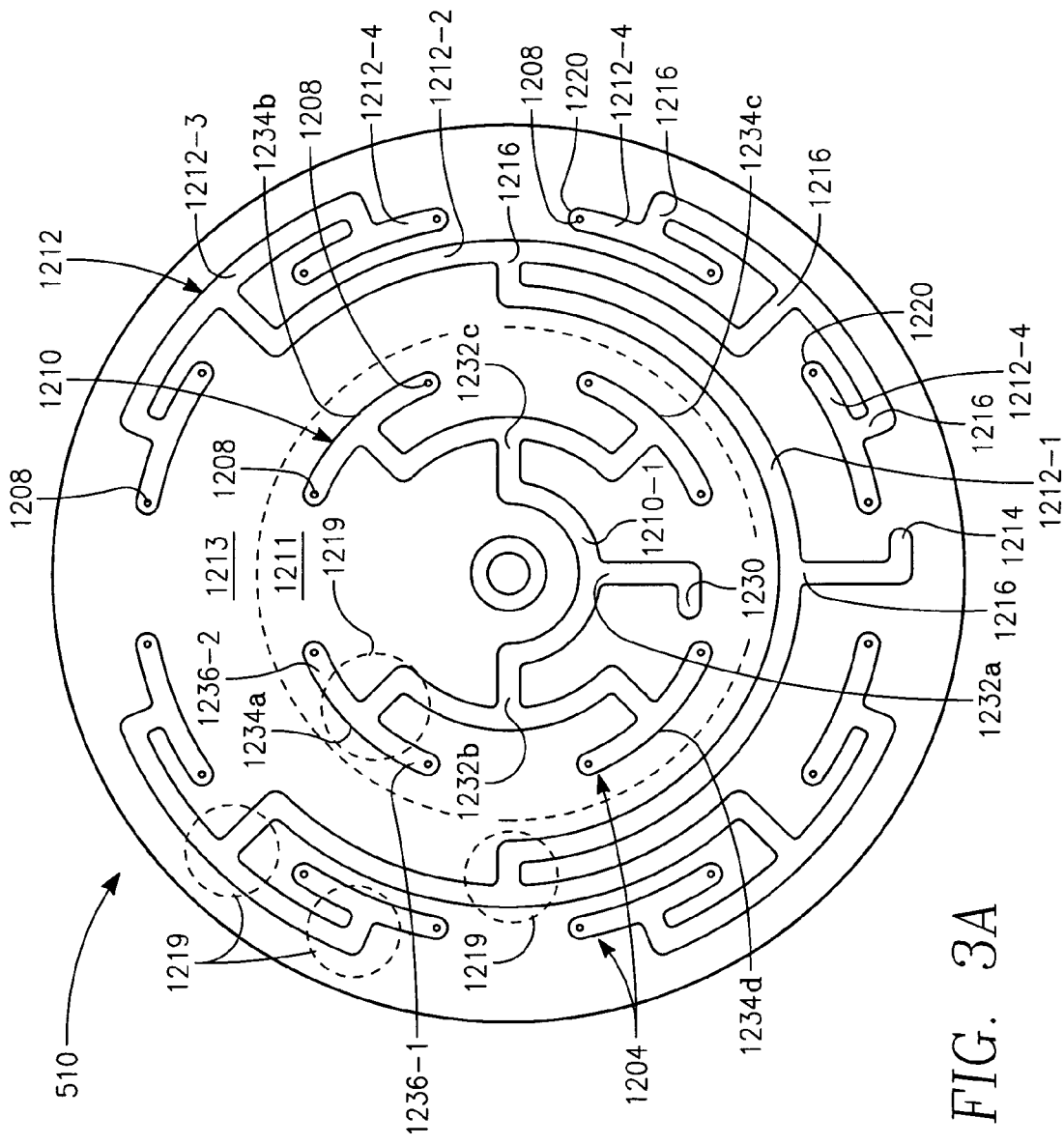
FIG. 3A is a top view of the top surface of a manifold of the gas distribution plate of the reactor of FIG. 1.
Figure 3B:
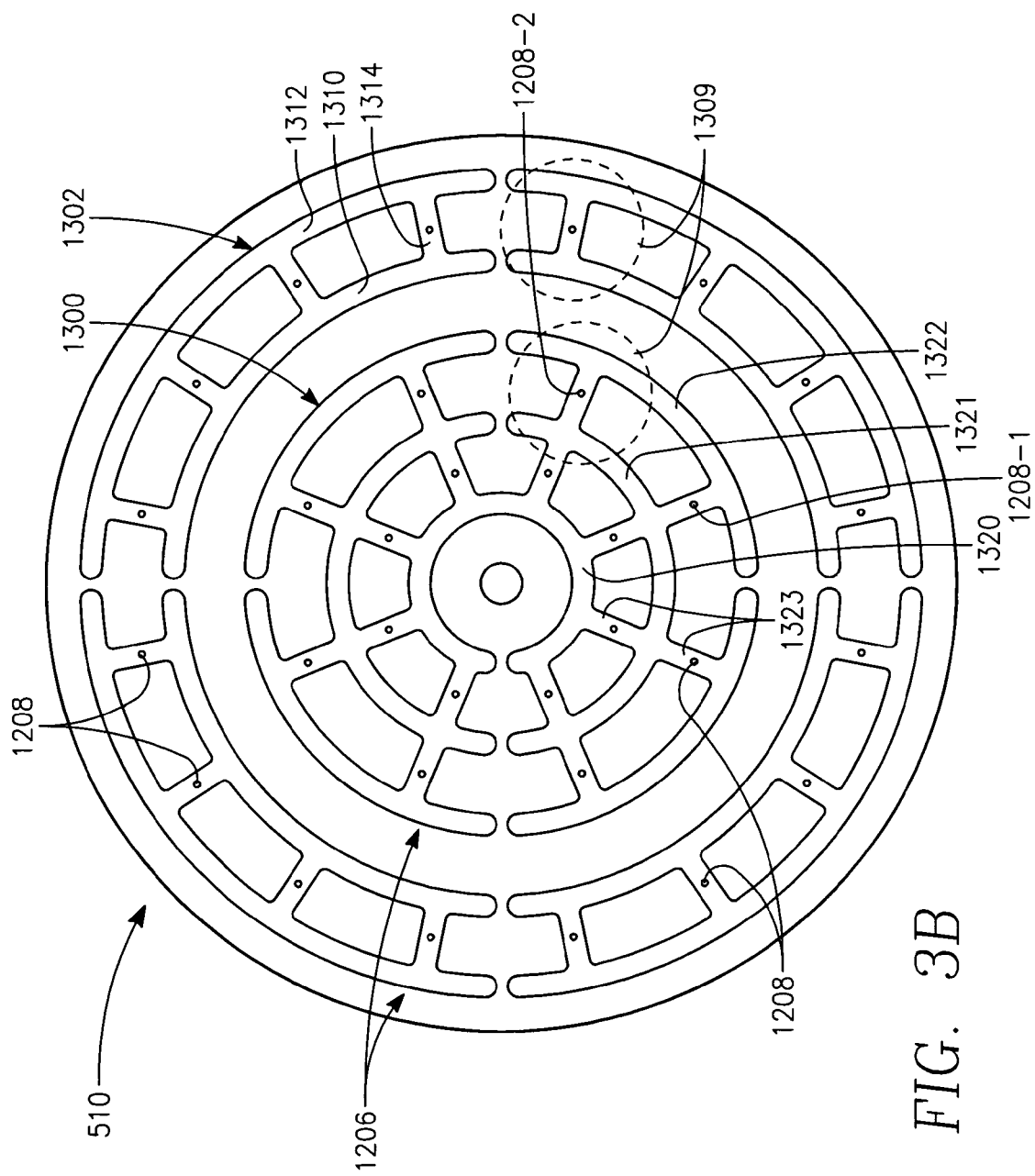
FIG. 3B is a top view of the bottom surface of the manifold of the gas distribution plate of the reactor of FIG. 1.
Figure 4:
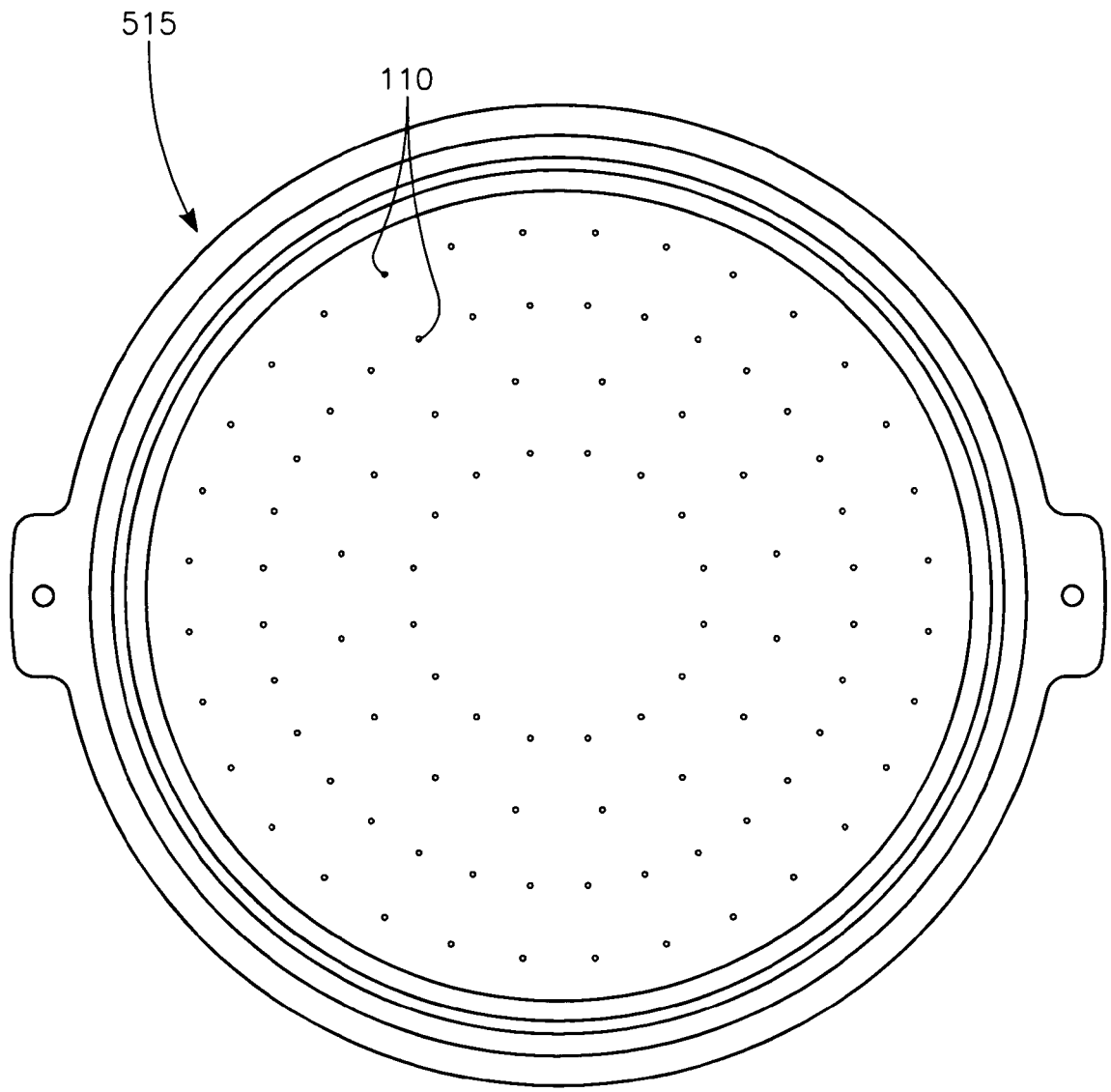
FIG. 4 is a top view of a showerhead of the gas distribution plate of the reactor of FIG. 1.

The manifold 510 in one embodiment is a disk depicted in the top and bottom views of FIGS. 3A and 3B, having gas distribution passages formed as channels 1204 in its top surface (FIG. 3A) and channels 1206 in its bottom surface (FIG. 3B). The top surface channels 1204 communicate with the bottom surface channels 1206 through orifices 1208 extending through the manifold 510. The top surface channels 1204 of FIG. 3A may consist of a radially inner group of channels 1210 occupying a circular region or inner zone 1211, and a radially outer group of channels 1212 occupying an annular region or outer zone 1213. In one embodiment, the showerhead/ceiling assembly 108 (FIG. 1) divides gas distribution into plural concentric independent gas distribution zones. In the illustrated embodiment of the manifold 510 of FIG. 3, these zones consist of the circular inner zone 1211 (having the inner group of channels 1210) and the annular outer zone 1213 (having the outer group of channels 1212).

In one embodiment, the outer channels 1212 of the manifold 510 begin at a receiving end 1214 that faces an axial port 1202a (shown in FIG. 2) of the gas supply passage 1202 of the lid 505. In the embodiment of FIG. 3A, the outer channels 1212 are laid out in multiple T-junctions 1216 in which gas flow is equally divided into opposite circumferential directions at each T-junction 1216. Each T-junction 1216 is at the center of a corresponding T-pattern 1219. The T-junctions 1216 are cascaded so that gas flow is divided among successively shorter arcuate channels 1212-1, 1212-2, 1212-2, 1212-4 in a sequence beginning with the long channels 1212-1 and ending with the short channels 1212-4. The short channels 1212-4 are terminated at tip ends 1220. Each of the orifices 1208 is located at a respective one of the tip ends 1220. Each T-pattern 1219 is symmetrical about the corresponding T-junction 1216 so that the distances traveled through the channels 1212 by gas from the receiving end 1214 to the different orifices 1208 are all the same. This feature can provide uniform gas pressure throughout all the orifices 1208 in the outer gas zone 1213.

In one embodiment, the inner zone channels 1210 in the embodiment of FIG. 3A are likewise arranged in T-patterns. The inner zone channels 1210 of the manifold 510 of FIG. 3A begin at a gas receiving end 1230 that underlies an axial port 1201a of the lid 505 (shown in FIG. 2) of the supply channel 1201 in the lid 505. Returning to FIG. 3A, in one embodiment, the gas flow is split into two opposing circumferential directions along a concentric channel 1210-1 at a first T-junction 1232a, gas flow in each of those two opposing directions then being split in half at a pair of T-junctions 1232b, 1232c, creating four divided gas flow paths that supply four respective T-patterns 1234a, 1234b, 1234c, 1234d. Each one of the T-patterns 1234a-1234d consists of channels 1236-1, 1236-2 forming the T-pattern. A corresponding one of the orifices 1208 is located within and near the tip end of a corresponding one of the T-pattern channels 1236-1, 1236-2. The T-patterns 1234a through 1234d are symmetrical so that the gas flow distances from the receiving end 1230 to each of the orifices 1208 in the inner zone are the same, in order to ensure uniform gas pressure at the orifices 1208 in the inner zone 1211. The gas flow extends less than a circle (e.g., less than a half-circle in the embodiment of FIG. 3A) in opposing directions from the input end 1230.

Referring to the bottom view of the manifold 510 illustrated in FIG. 3B, bottom surface channels 1206 in the bottom surface of the manifold 510 are divided into a circular inner zone 1300 and an annular outer zone 1302 surrounding the inner zone 1300, in one embodiment. In the illustrated embodiment, the channels 1206 in each of the zones 1300, 1302 form successive "H" patterns 1309. In the outer zone 1302, for example, the channels consist of arcuate concentric channels 1310, 1312 and radial channels 1314. Each "H" pattern 1309 is formed by one of the radial channels connecting the concentric channels 1310, 1312. Each of the concentric channels 1310, 1312 extends over a limited arc (e.g., a quarter circle). The orifices 1208 in the outer zone 1302 are located in the center of each radial channel 1314.

In one embodiment, in the inner zone 1300, the bottom surface channels 1206 include sets of arcuate concentric channels 1320, 1321, 1322, each extending less than a complete circle. The innermost circumferential channel 1320 extends around an arc that is nearly (but slightly less than) a complete circle. The next circumferential channel 1321 (of which there are two) extends around an arc of about a half circle. The next circumferential channel 1322 (of which there are four) extends around an arc of about a quarter of a circle. Radial channels 1323 connect the arcuate channels 1320, 1321, 1322. An "H" pattern 1309 is formed by the connection between each radial channel 1323 and the pair of the concentric channels 1321, 1322. Orifices 1208 are located in the radial channels 1323 halfway between the concentric channels 1321, 1322. In addition, some orifices 1208 are located in the innermost concentric channel 1320. In FIG. 3B, the two orifices 1208-1 and 1208-2 in the inner zone 1300 are the orifices of the T-pattern 1234b of FIG. 3A.

FIG. 4 depicts an embodiment of the showerhead 515 and the gas injection orifices 110 that extend therethrough. Various ones of the showerhead gas injection orifices 110 are aligned with various ones of the bottom surface channels 1206 of the manifold 510. Since each of the injection orifices extends completely through the showerhead 515, their hole patterns on the top and bottom faces of the showerhead 515 are the same.

The top surface channels 1204 of the manifold 510 can uniformly distribute gas pressure from each of the inner and outer zone gas input channels 1201, 1202 to the orifices 1208. The bottom surface channels 1206 in the manifold 510 can uniformly distribute gas pressure from orifices 1208 of the manifold 510 to the gas injection orifices 110 of the showerhead 515.

Figure 5:
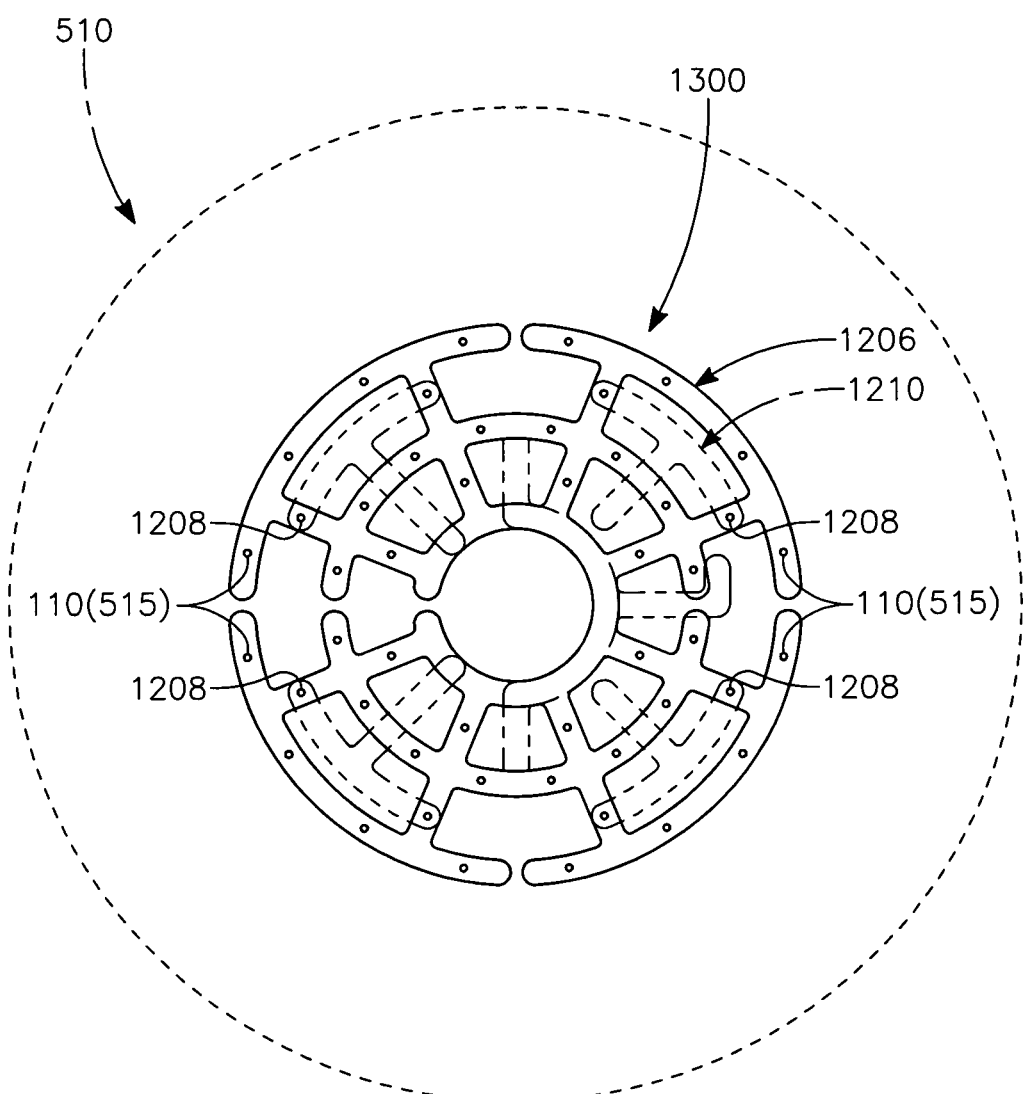
FIG. 5 is a top view of the inner zone of the manifold of FIG. 3B and showing the alignment of the gas injection orifices 110 of the showerhead of FIG. 4 relative to the inner zone of the manifold of FIG. 3B.
Figure 6:
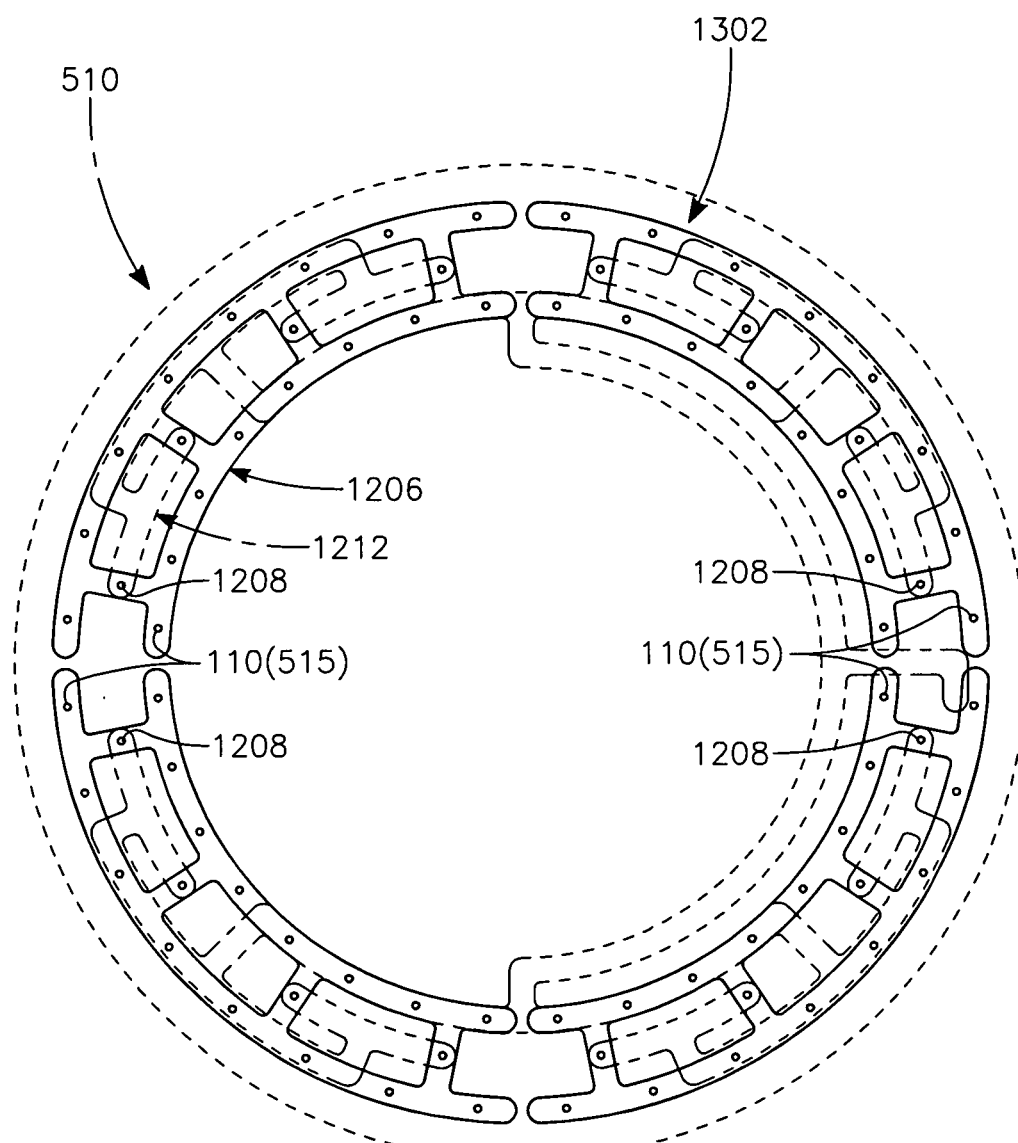
FIG. 6 is a top view of the outer zone of the manifold of FIG. 3B and showing the alignment of the gas injection orifices 110 of the showerhead of FIG. 4 relative to the outer zone of the manifold of FIG. 3B.

FIG. 5 depicts the alignment of the showerhead gas injection orifices 110 with the inner zone 1300 of bottom surface channels 1206 of the manifold 510 in accordance with one embodiment. FIG. 6 depicts the alignment of the showerhead gas injection orifices 110 with the outer zone 1302 of bottom surface channels 1206 of the manifold 510 in accordance with one embodiment. In an embodiment illustrated in FIG. 5, the gas flow path from a manifold orifice 1208 to the closest showerhead gas injection orifice 110 is the same for all manifold orifices 1208 of the inner zone 1300. In FIG. 6, the gas flow path from a manifold orifice 1208 to the corresponding showerhead gas injection orifice 110 is the same for all manifold orifices 1208 of the outer zone 1302. This feature can provide a uniform gas pressure at all gas injection orifices 110 of the showerhead 515 within each zone 1300, 1302, while the different zones 1300, 1302 may have different gas pressures.

Figure 7:
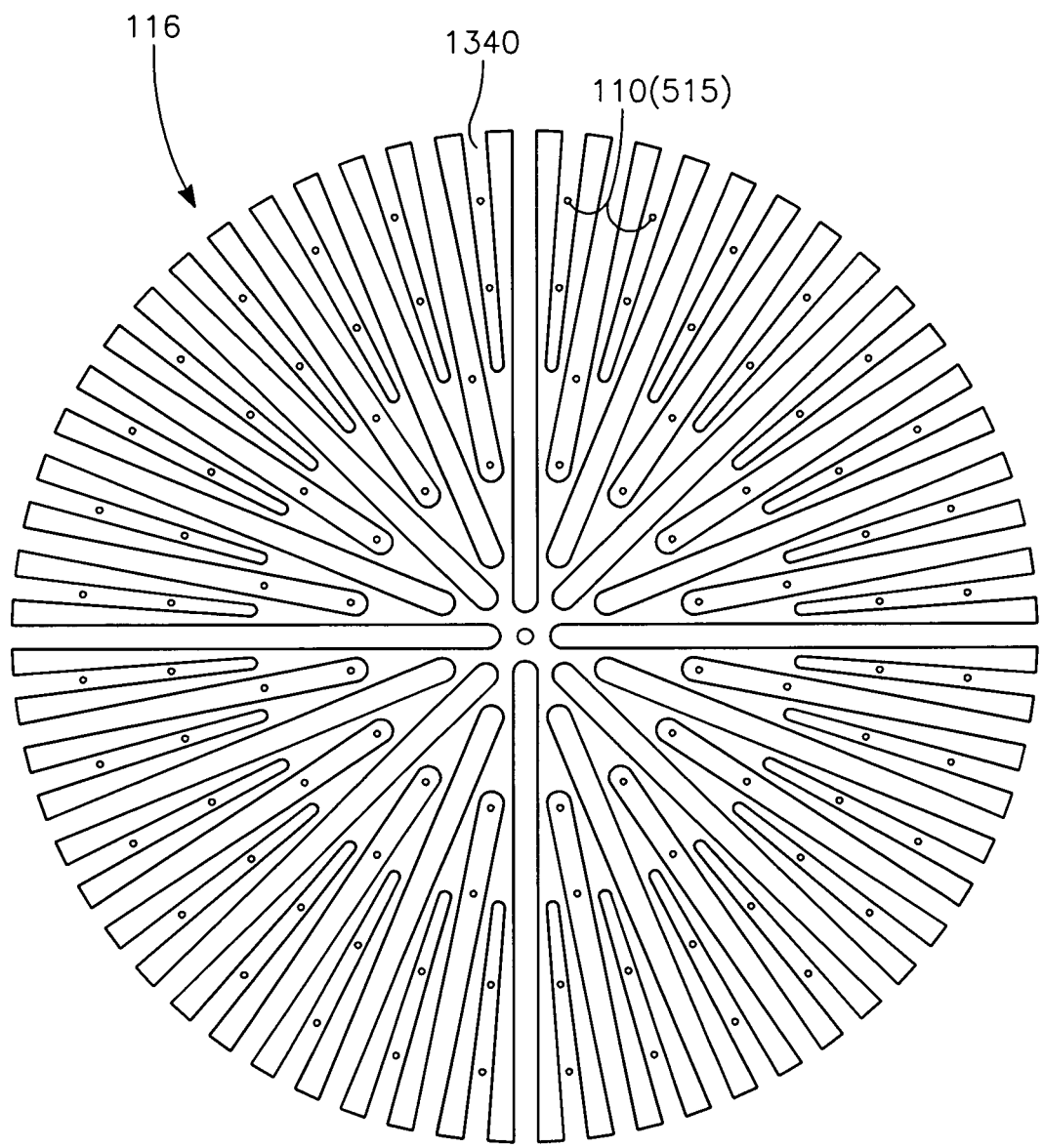
FIG. 7 is a top view of one embodiment of the ceiling electrode in the reactor of FIG. 1.

FIG. 7 is a top view of the planar electrode 116 formed inside the showerhead 515 as a thin conductive layer in accordance to an embodiment of the present invention. The radial slots 1340 in the electrode 116 are provided if the inductively coupled power applicator 114 is present. The radial slots 1340 prevent absorption of inductively coupled power by the electrode 116, thereby enabling power to be inductively coupled from the coil antenna 114 through the electrode 116 and into the chamber with little or no loss. Optionally, as indicated in FIG. 4, the radial slots 1340 may coincide with the gas injection orifices 110 of the showerhead 515 (although the orifices 110 would not normally be visible in the view of FIG. 4). If the coil antenna 114 is not present, then the radial slots 1340 may be eliminated, in which case the electrode 116 forms a continuous surface.

Figure 8A:
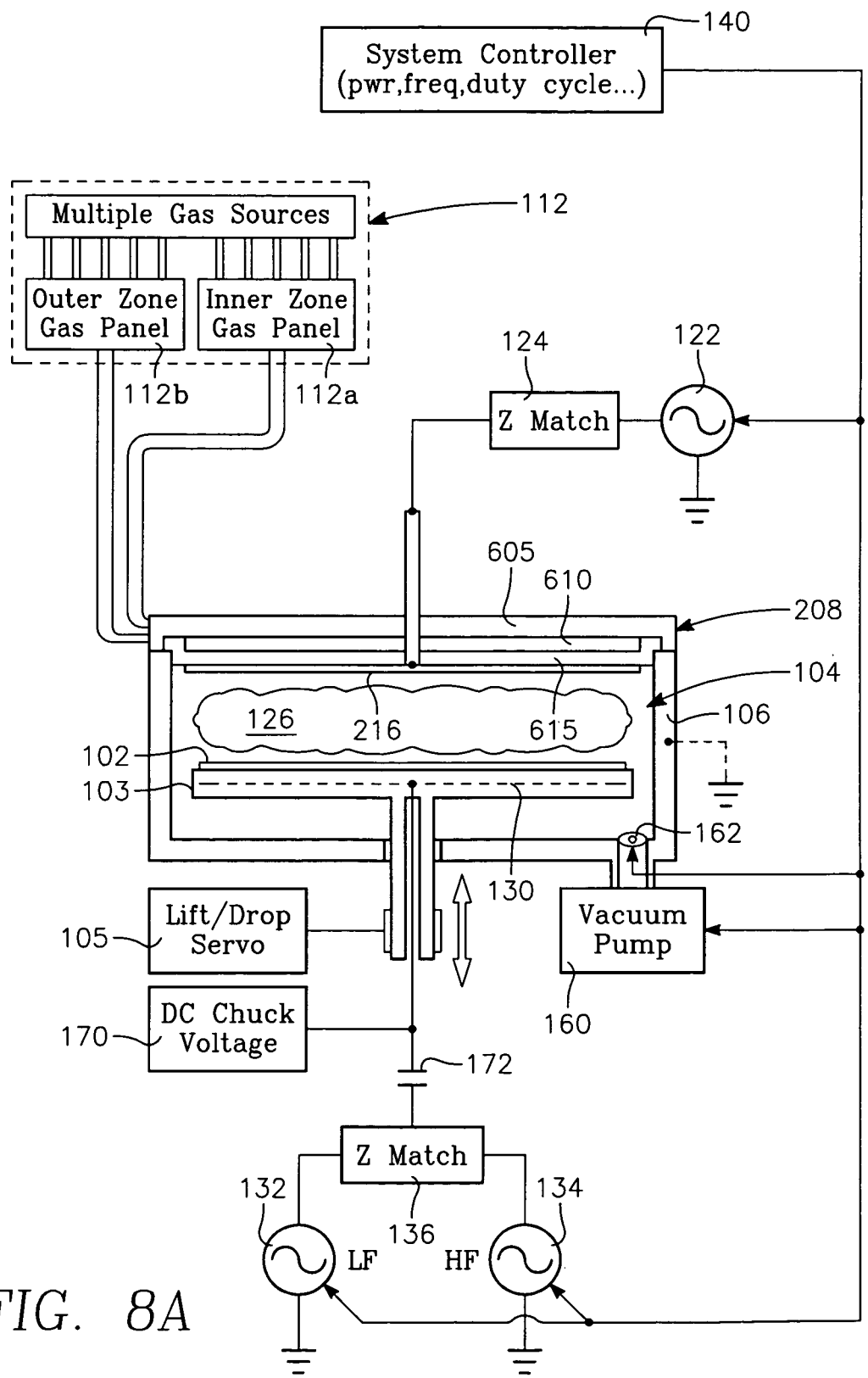
FIG. 8A includes a cut-away side view of a plasma reactor in accordance with a further embodiment, in which a lid, a path splitting manifold and a showerhead are axially stacked, and the path splitting manifold is radially distributed.
Figure 8B:
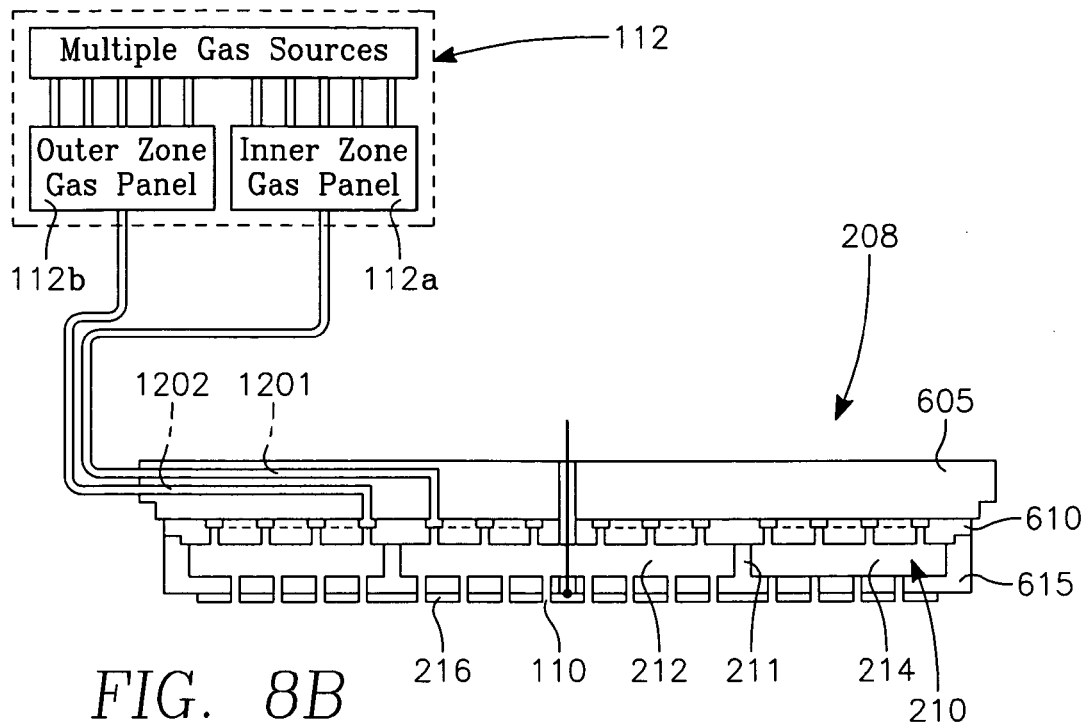
FIG. 8B is an enlarged side view of the showerhead assembly of FIG. 8A.

External Distribution Plate with Single Flow Splitting Layer:

FIGS. 8A and 8B depict a plasma reactor in accordance with one embodiment in which a modified showerhead assembly 208 replaces the showerhead assembly 108 of FIG. 1. The modified showerhead assembly 208 includes the lid 505 of FIG. 2. It further includes a manifold 610 depicted in FIGS. 10A and 10B. It further includes a showerhead 615 depicted in FIG. 10. The showerhead assembly 208 can include a ceiling electrode 216, which may be below the showerhead 615.

Figure 9A:
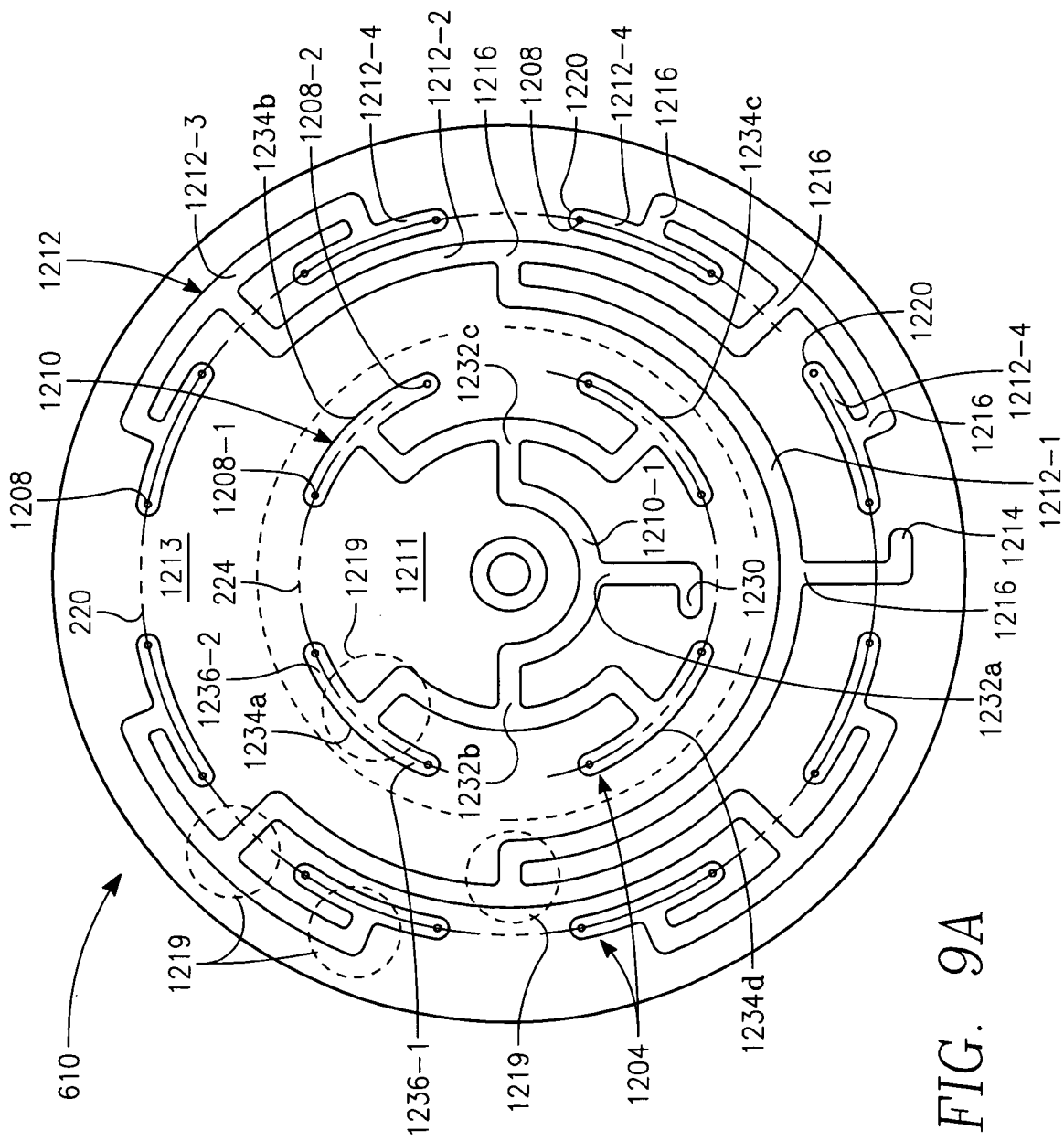
FIG. 9A is a top view of the top surface of the manifold of the gas distribution plate of the reactor of FIG. 8A.
Figure 9B:
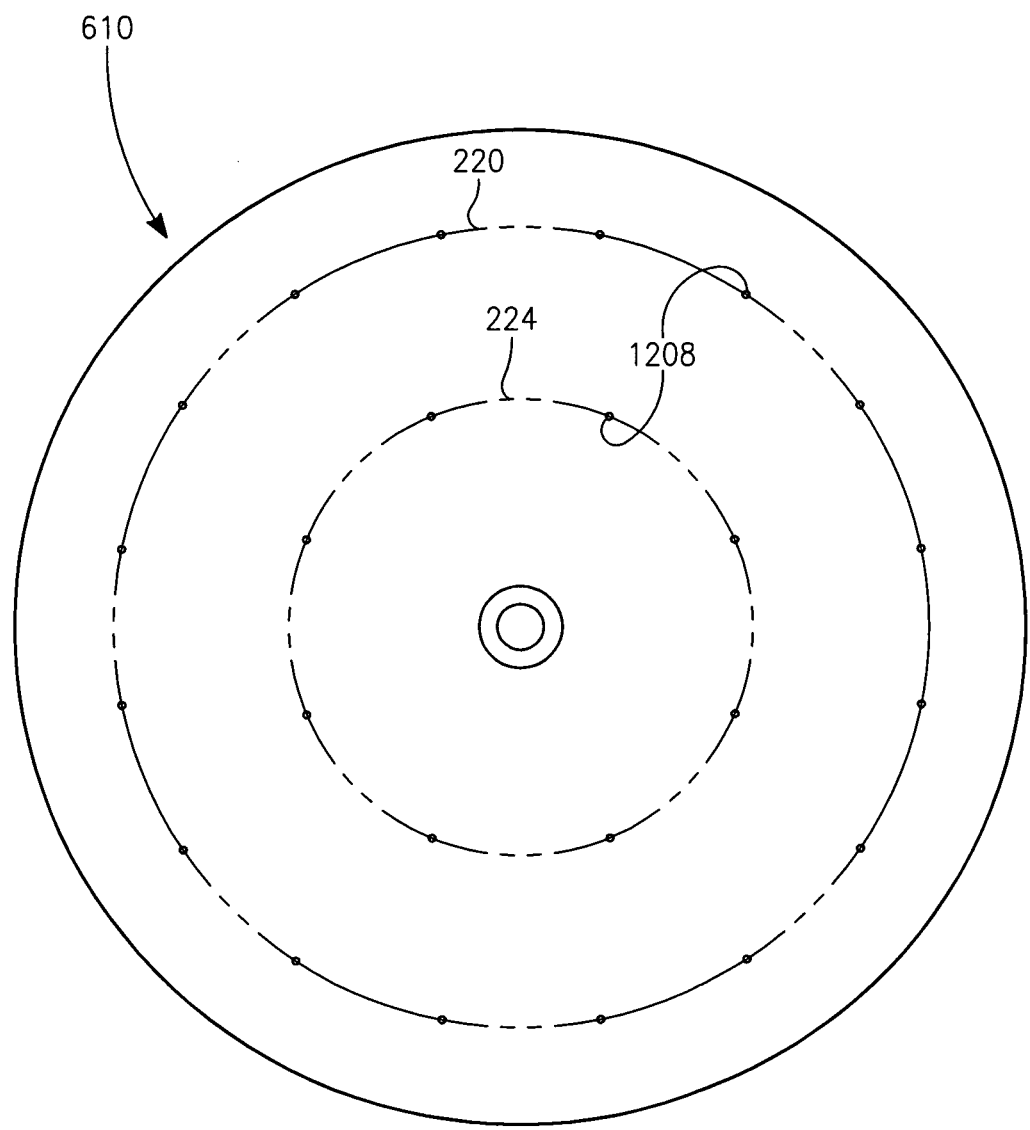
FIG. 9B is a top view of the bottom surface of the manifold of the gas distribution plate of the reactor of FIG. 8A.
Figure 10:
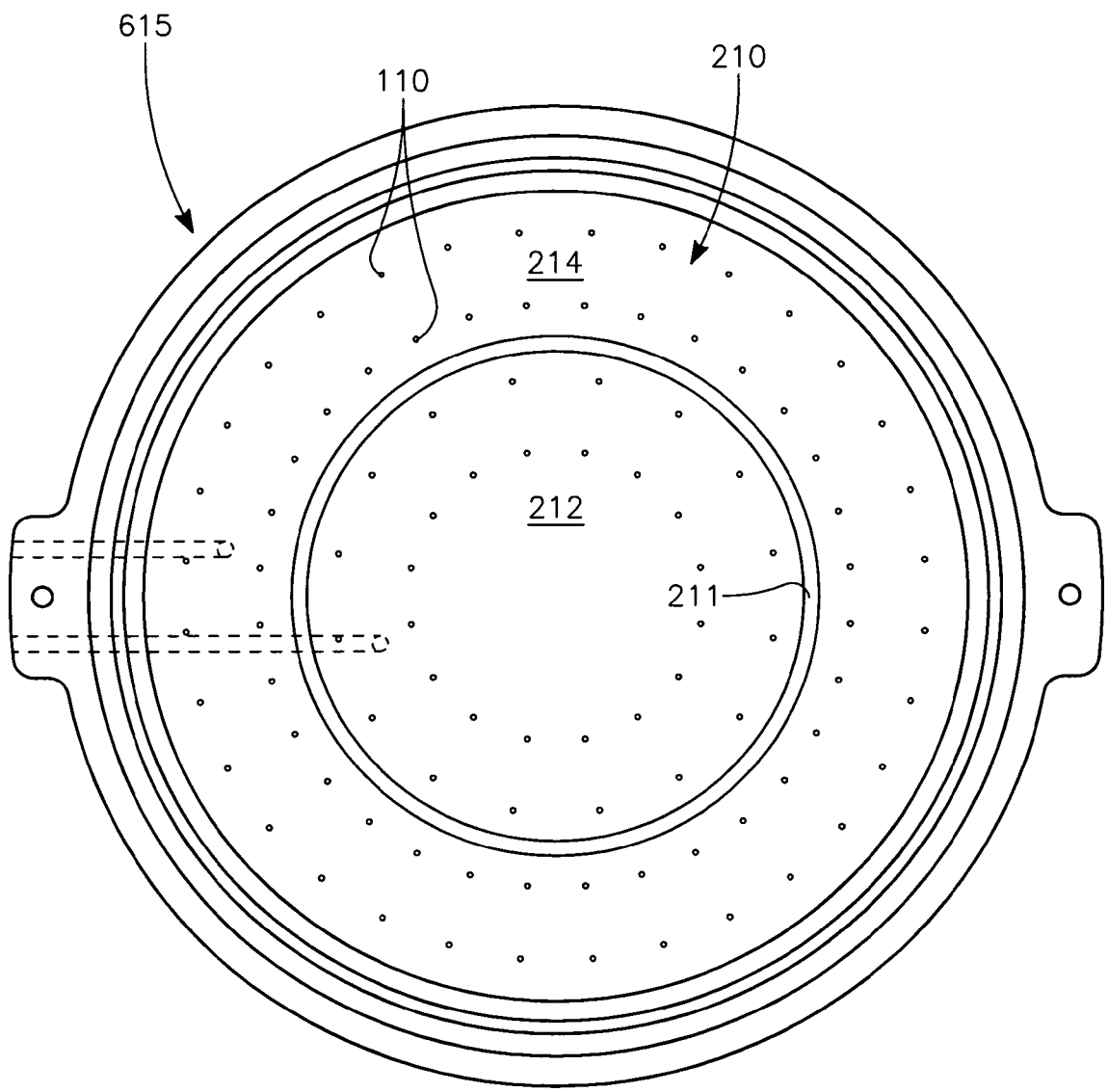
FIG. 10 is a top view of a showerhead of the gas distribution plate of the reactor of FIG. 8A.

The manifold 610 is depicted in the top and bottom views of FIGS. 9A and 9B. Referring to FIG. 9A, in one embodiment, the top surface of the manifold 610 has gas distribution passages formed as channels 1204. Referring to FIG. 9B, the bottom surface of the manifold 610 is flat and devoid of channels. The showerhead 615 shown in FIG. 10 is shaped to form the bottom and sides of an empty volume or plenum 210 shown in FIG. 8B, the top of which is enclosed by the manifold 610. The top surface channels 1204 communicate with the plenum 210 through orifices 1208 extending through the manifold 610.

In one embodiment, the top surface channels 1204 consist of a radially inner group of channels 1210 occupying a circular region or inner zone 1211 and a radially outer group of channels 1212 occupying an annular region or outer zone 1213 (as shown in FIG. 9A). There are plural concentric independent gas distribution zones. In the illustrated embodiment, these zones consist of the circular inner zone 1211 (having the inner group of channels 1210) and the annular outer zone 1213 (having the outer group of channels 1212).

The outer channels 1212 begin at a receiving end 1214 that faces an axial port 1202a (shown in FIG. 9) of the gas supply passage 1202 of the lid 605. Referring again to FIG. 9A, the outer channels 1212 are laid out in multiple T-junctions 1216 in which gas flow is equally divided into opposite circumferential directions at each T-junction 1216. Each T-junction 1216 is at the center of a corresponding T-pattern 1219. The T-junctions 1216 are cascaded so that gas flow is divided among successively shorter arcuate channels 1212-1, 1212-2, 1212-2, 1212-4 in a sequence beginning with the long channels 1212-1 and ending with the short channels 1212-4. The short channels 1212-4 are terminated at tip ends 1220. Each of the orifices 1208 is located at a respective one of the tip ends 1220. Each T-pattern 1219 in the illustrated embodiment is symmetrical about the corresponding T-junction 1216 so that the distances traveled through the channels 1212 by gas from the receiving end 1214 to the different orifices 1208 are all the same. This feature can provide uniform gas pressure throughout all the orifices 1208 in the outer gas zone 1213.

The inner zone channels 1210 of FIG. 9A are arranged in T-patterns, in one embodiment. The inner zone channels 1210 begin at a gas receiving end 1230 that underlies an axial port 1201a (shown in FIG. 9) of the supply channel 1202 in the lid 605. In one embodiment, the gas flow is split into two opposing circumferential directions along a concentric channel 1210-1 at a first T-junction 1232a, gas flow in each of those two opposing directions then being split in half at a pair of T-junctions 1232b, 1232c, creating four divided gas flow paths that supply four respective T-patterns 1234a, 1234b, 1234c, 1234d. Each one of the T-patterns 1234a-1234d consists of a pair of channels 1236-1, 1236-2 forming the T-pattern. A corresponding one of the orifices 1208 is located within and near the tip end of a corresponding one of the T-pattern channels 1236-1, 1236-2. The T-patterns 1234a through 1234d are symmetrical so that the gas flow distances from the receiving end 1230 to each of the orifices 1208 in the inner zone are the same, in order to ensure uniform gas pressure at the orifices 1208 in the inner zone 1211. The gas flow extends less than a circle (e.g., less than a half-circle in the embodiment of FIG. 9A) in opposing directions from the input end 1230.

In the foregoing embodiment, the manifold 610 provides only a single layer of path-splitting channels 1204 whose gas outlet holes 1208 directly feed the plenum 210 shown in FIG. 8B. Gas flowing through the outlet holes 1208 gathers in the plenum 210 and is injected into the chamber interior through the holes 110 in the showerhead 615.

Referring to FIG. 10, in one embodiment, an annular wall 211 in the plenum 210 divides the plenum into concentric inner and outer plenums 212, 214 fed by the inner and outer zones 1211, 1213 of the manifold 610 respectively. The annular wall 211 extends from the top surface of the showerhead 615 to the bottom surface of the manifold 610.

In one embodiment, referring to FIG. 9A, in one embodiment the outlet holes 1208 of the manifold 610 are arranged along concentric imaginary circles 220, 224 indicated in phantom line. The gas outlet holes 1208 of the outer zone 1213 lie along the outermost circle 220. The gas outlet holes 1208 of the inner zone 1211 lie along an intermediate circle 224. The outlet holes 110 of the showerhead 615 may be more closely spaced and more numerous than the outlet holes 1208 of the manifold 610, as shown in FIG. 10.

Figure 11:
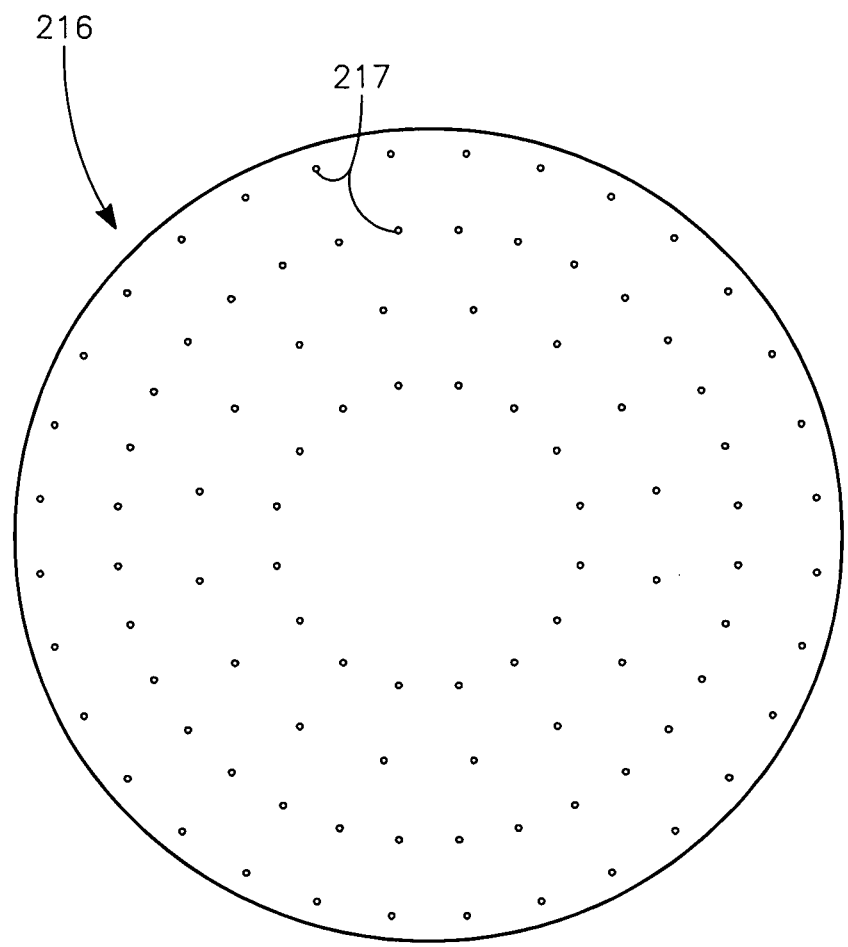
FIG. 11 is a top view of one embodiment of the ceiling electrode in the reactor of FIG. 8A.

FIG. 11 illustrates the overhead electrode 216. In the embodiment of FIG. 8B, the electrode 216 may be placed beneath the showerhead 615. The electrode 216 has gas outlet holes 217 in registration with the gas outlet holes 110 of the showerhead 615, as shown in FIG. 11.

Figure 8C:
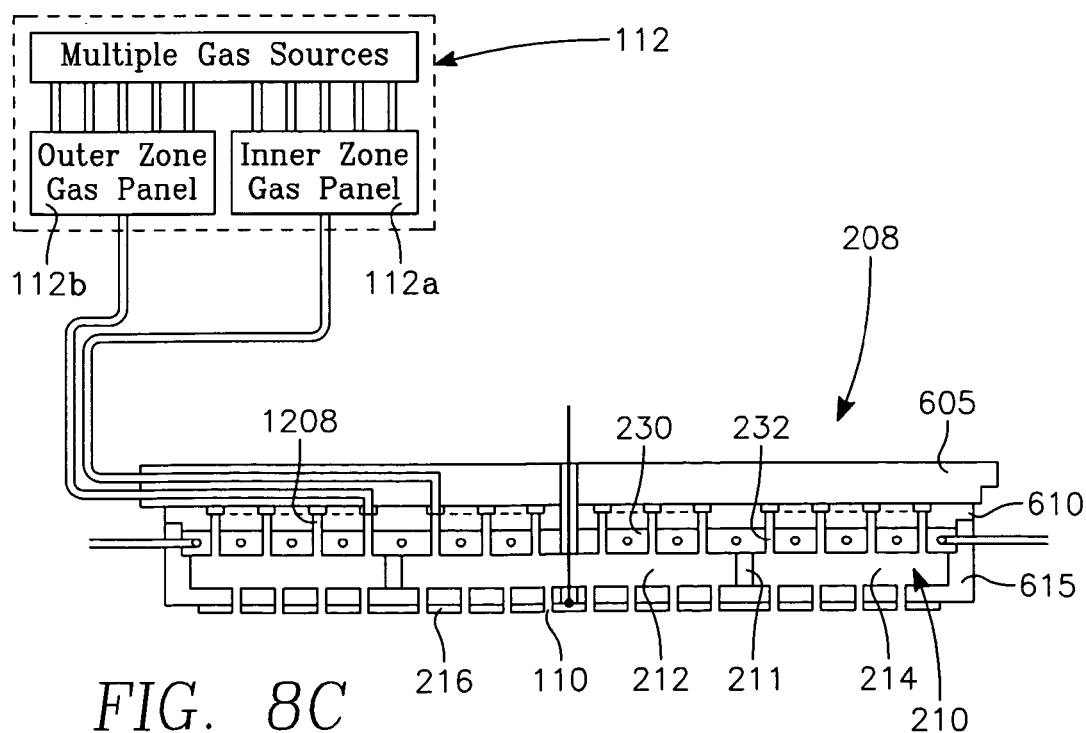
FIG. 8C is an enlarged side view of a showerhead assembly of a related embodiment in which the manifold of FIG. 8A is separated from the showerhead by a temperature control plate.

Referring to the embodiment of FIG. 8C, the lid 605 and manifold 610 may be external or separated from the showerhead 615. In one embodiment, this separation may accommodate a temperature control plate 230, such as a chiller or heater plate, between the manifold 610 and the showerhead 615. In the embodiment of FIG. 8C, the temperature control plate 230 has holes 232 extending through it that are in registration with the outlet holes 1208 of the manifold 610. The plenum 210 is defined between the showerhead 615 and the temperature control plate 230. In one implementation of the embodiment of FIG. 8C, the annular wall 211 of FIG. 10 extends from the top surface of the showerhead 615 to the bottom surface of the temperature control plate 230. The annular wall 211 divides the plenum 210 into inner and outer plenums 212, 214.

In the embodiment of FIG. 8A, successive ones of the channels 1204 in the top surface of the manifold 610 are split into a pair of channels of equal length, in a hierarchy of successively split channels, as described above. The manifold 610 may therefore be referred to as a path splitting manifold. The successively split channels 1204 terminate at individual ones of the outlet holes 1208. The outlet holes are axial, while the manifold 610 and the showerhead 615 are axially displaced from one another, so that the manifold outlet holes 1208 axially feed the showerhead 615, in accordance with the foregoing description.

Figure 12:
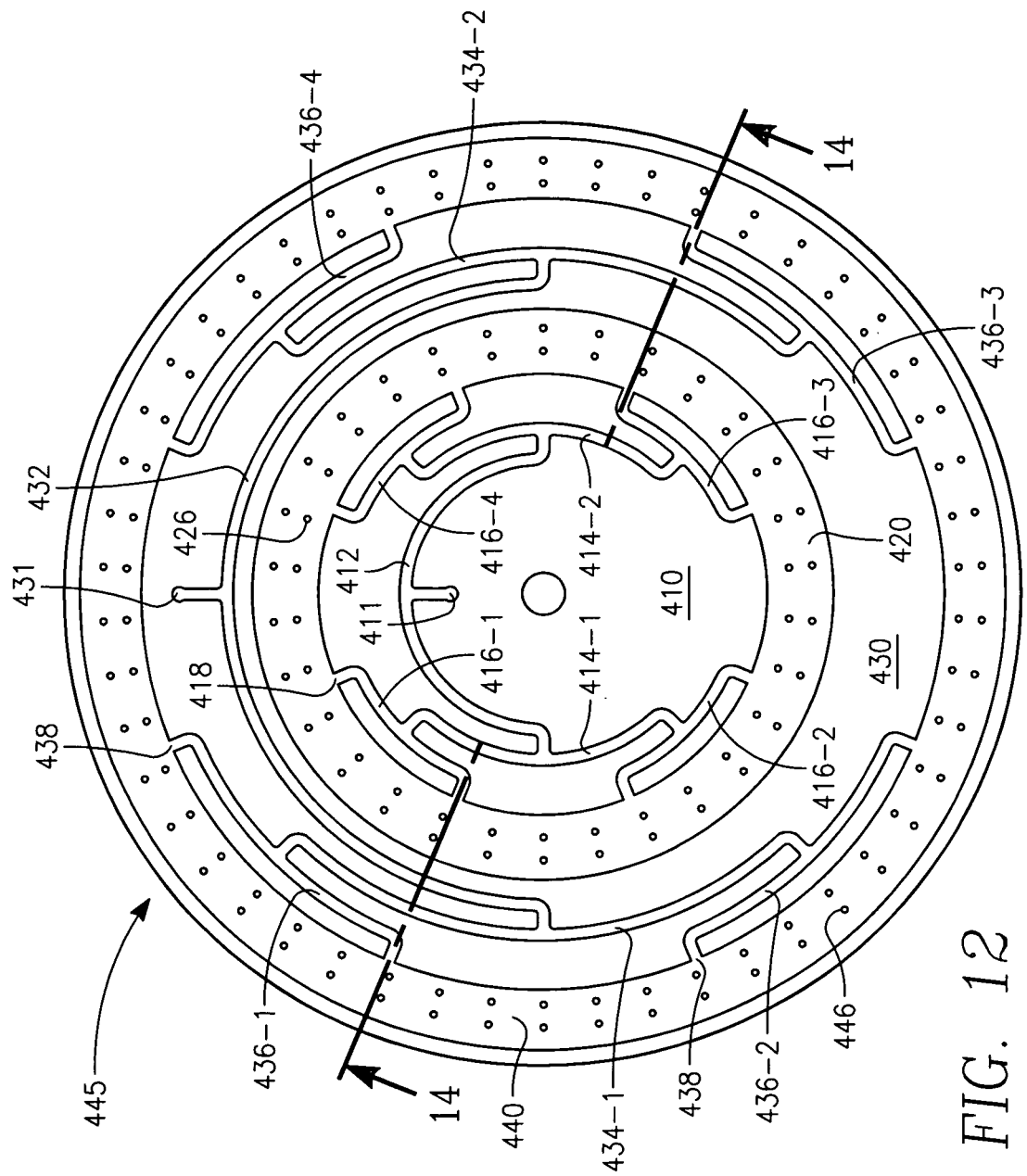
FIG. 12 is a top view of a showerhead assembly in accordance with an embodiment in which the manifolds and showerheads are radially juxtaposed rather than being axially stacked, and the manifolds feed gas in a radially outward direction.
Figure 13:
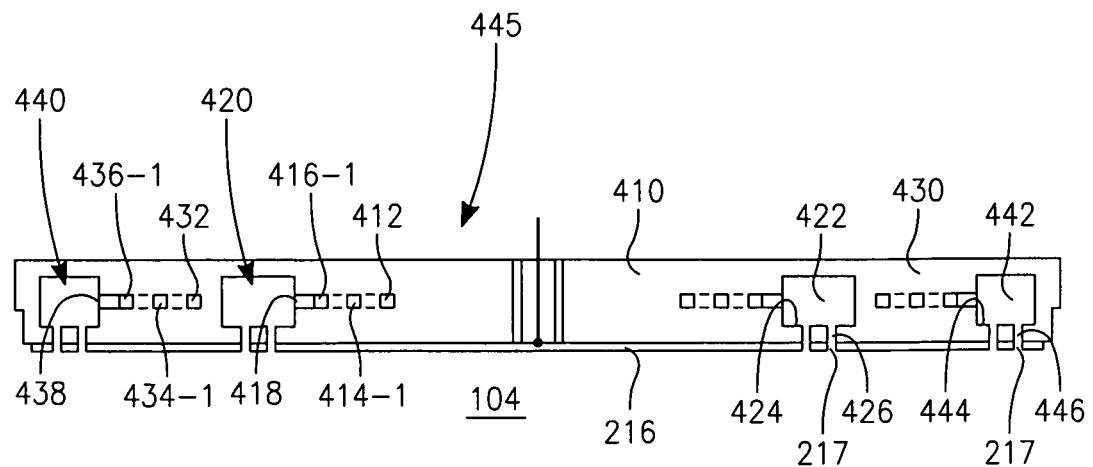
FIG. 13 is a cut-away side view corresponding to FIG. 12.

Radially Coupled Gas Distribution Plate:

FIG. 12 depicts an embodiment in which a path splitting manifold feeds a showerhead in the radial direction, as distinguished from the axial direction. Referring to FIGS. 12 and 13, an inner path splitting manifold 410 has a gas supply inlet 411 from which gas flow is split between two halves of a half-circle gas flow channel 412. Gas flow from each of the two ends of the channel 412 is split between two halves of respective quarter circle channels 414-1, 414-2. Gas flow from each of the two ends of each channel 414-1, 414-2 is split between two halves of respective one-eighth circle channels 416-1 through 416-4. Specifically, gas flow from each end of the channel 414-1 is split between two halves of a respective one of the channels 416-1 and 416-2. Similarly, gas flow from each end of the channel 414-2 is split between two halves of a respective one of the channels 416-3 and 416-4. Each of the channels 416-1 through 416-4 has a pair of ends terminating in respective radial outlet holes 418, there being a total of eight outlet holes extending in the radial direction in the illustrated embodiment. Other embodiments may have a different number of outlets. An inner showerhead 420 surrounds or radially faces the inner manifold 410 and receives gas flow from the manifold 410 through the radial holes 418. The inner showerhead 420 includes an inner plenum 422 having a floor 424 with gas injection holes 426 extending axially through the floor and providing gas flow into the reactor chamber interior 104.

While the channel 412 is described above as a half circle, the channels 414-1 and 414-2 are described as being quarter circles and the channels 416-1 through 416-4 are described as being one-eighth circles, these channels may be of any suitable lengths, provided gas flow into each channel enters at the midpoint along the length of the channel. This ensures equal path lengths from the main inlet 411 to each of the outlets 418.

In one embodiment, an outer path splitting manifold 430 has a gas supply inlet 431 from which gas flow is split between two halves of a half-circle gas flow channel 432. Gas flow from each of the two ends of the channel 432 is split between two halves of respective quarter circle channels 434-1, 434-2. Gas flow from each of the two ends of each channel 434-1, 434-2 is split between two halves of respective one-eighth circle channels 436-1 through 436-4. Specifically, gas flow from each end of the channel 434-1 is split between two halves of a respective one of channels 436-1 and 436-2. Similarly, gas flow from each end of the channel 434-2 is split between two halves of a respective one of channels 436-3 and 436-4. Each of the channels 436-1 through 436-4 has a pair of ends terminating in respective radial outlet holes 438, there being a total of eight outlet holes extending in the radial direction in the illustrated embodiment. Other embodiments may have a different number of outlets. An outer showerhead 440 surrounds or radially faces the outer manifold 430 and receives gas flow from the manifold 430 through the radial holes 438. The outer showerhead 440 includes a plenum 442 having a floor 444 with gas injection holes 446 extending axially through the floor and providing gas flow into the reactor chamber interior 104.

While the channel 432 is described above as a half circle, the channels 434-1 and 434-2 are described as being quarter circles and the channels 436-1 through 436-4 are described as being one-eighth circles, these channels may be of any suitable lengths, provided gas flow into each channel enters at the midpoint along the length of the channel. This ensures equal path lengths from the main inlet 431 to each of the outlets 438.

Figure 14:
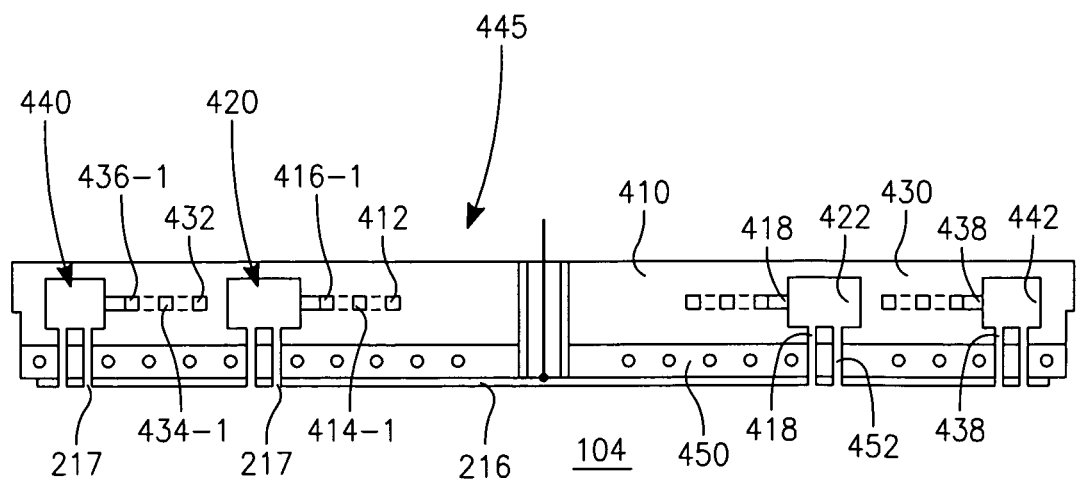
FIG. 14 is a cut-away side view of a related embodiment in which the gas distribution assembly is separated from the ceiling electrode by a temperature control plate.

In one embodiment, the inner manifold 410, the inner showerhead 420, the outer manifold 430 and the outer showerhead 440 are mutually concentric components comprising a gas distribution plate 445. As shown in FIG. 14, the electrode 216 underlies the bottom of the plate 445. The electrode has holes 217 some of which are in registration with the outlet holes 426 of the inner showerhead 420 and others of which are in registration with the outlet holes 446 of the outer showerhead 440. In the embodiment of FIG. 14, a temperature control plate 450, such as a chiller plate or heater plate, may be placed between the assembly 445 and the electrode 216. The temperature control plate 450 has holes 452 that continue the axial paths provided by the holes 426 of the inner showerhead 420 and the holes 446 of the outer showerhead 440.

FIGS. 13 and 14 depict embodiments in which each of the inner manifold 410 is planar or flat and is radially adjacent the showerhead 420.

In the embodiments of FIGS. 12 and 13, gas flow to each showerhead is in the radially outward direction.

Figure 15:
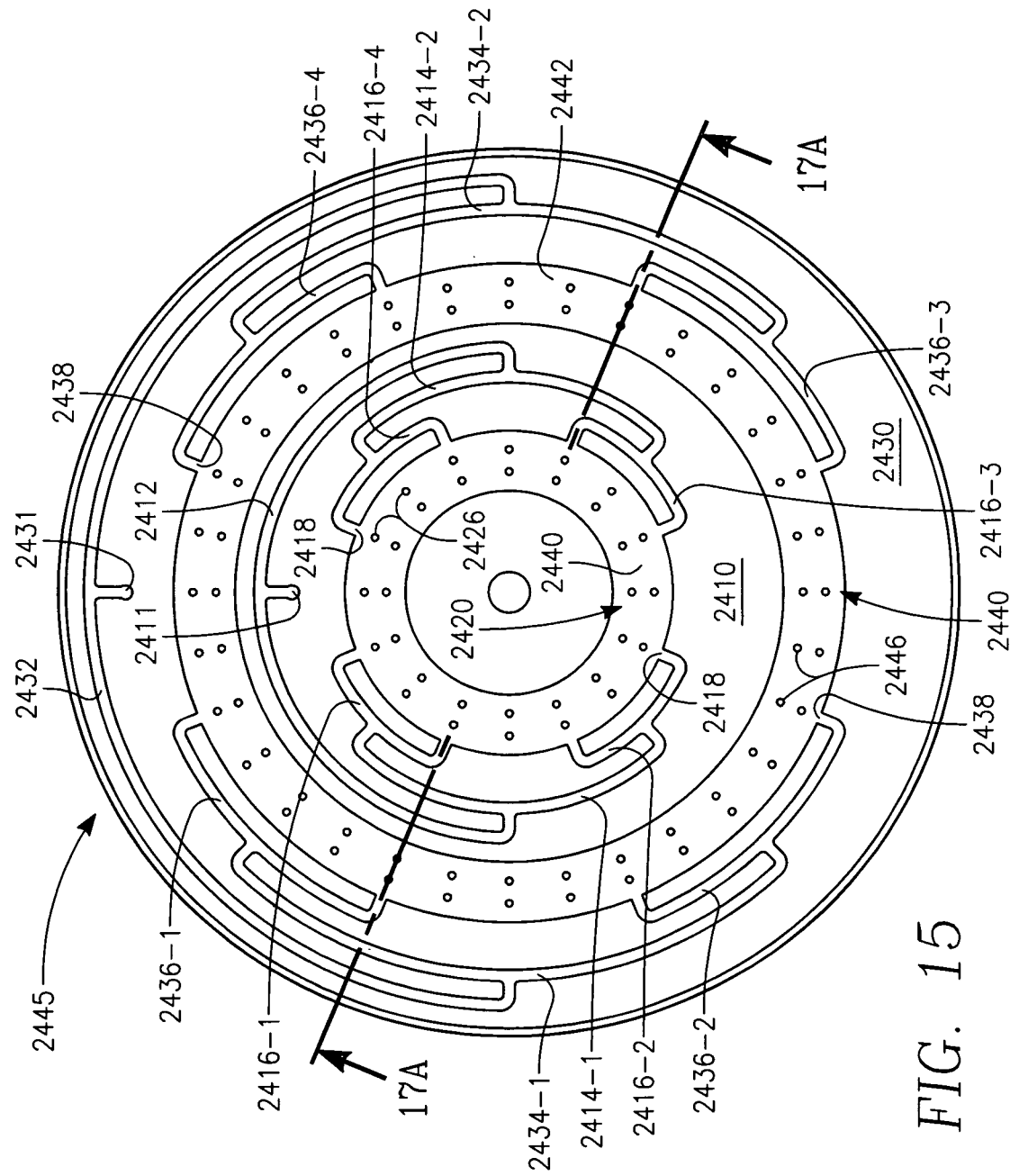
FIG. 15 is a top view of an embodiment in which the manifolds and showerheads are radially juxtaposed, and the manifolds feed gas in a radially inward direction.
Figure 16A:
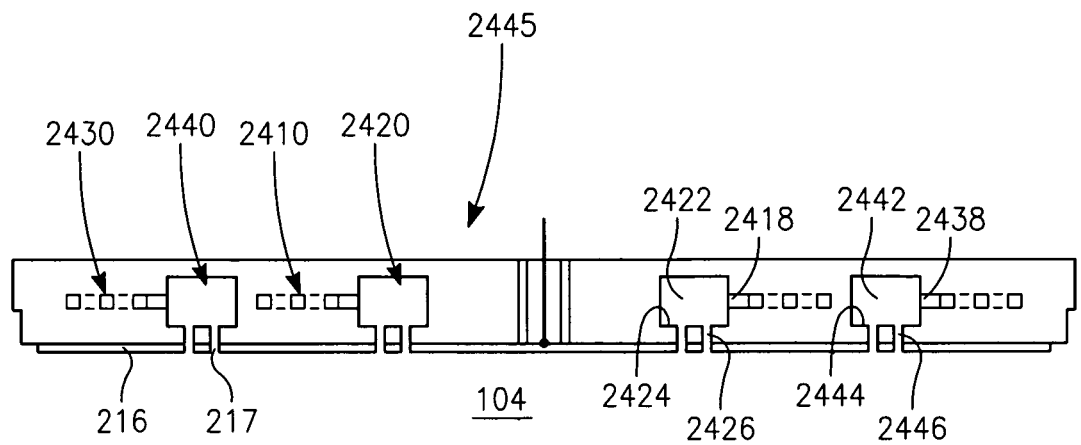
FIG. 16A is a cut-away side view corresponding to FIG. 15.

FIGS. 15 and 16A depict a different embodiment in which gas flow to each showerhead is in the radially inward direction. In the embodiment of FIGS. 15 and 16A, a center path splitting manifold 2410 surrounds and supplies gas to a center showerhead 2420, while an outer path splitting manifold 2430 surrounds and supplies gas to an outer showerhead 2440.

Referring to FIGS. 15 and 16A, in one embodiment, the inner path splitting manifold 2410 has a gas supply inlet 2411 from which gas flow is split between two halves of a half-circle gas flow channel 2412. Gas flow from each of the two ends of the channel 2412 is split between two halves of respective quarter circle channels 2414-1, 2414-2. Gas flow from each of the two ends of each channel 2414-1, 2414-2 is split between two halves of respective one-eighth circle channels 2416-1 through 2416-4. Specifically, gas flow from each end of the channel 2414-1 is split between two halves of a respective one of channels 2416-1 and 2416-2. Similarly, gas flow from each end of the channel 2414-2 is split between two halves of a respective one of channels 2416-3 and 2416-4. Each of the one-eighth circle channels 2416-1 through 2416-4 has a pair of ends terminating in respective radial outlet holes 2418, a total of eight outlet holes 2418 extending in the radial direction. The inner showerhead 2420 is surrounded by the inner manifold 2410 and receives gas flow in the radially inward direction from the manifold 2410 through the radial holes 2418. The inner showerhead 2420 includes an inner plenum 2422 having a floor 2424 with gas injection holes 2426 extending axially through the floor and providing gas flow into the reactor chamber interior 104.

The outer path splitting manifold 2430 has a gas supply inlet 2431 from which gas flow is split between two halves of a half-circle gas flow channel 2432. Gas flow from each of the two ends of the channel 2432 is split between two halves of respective quarter circle channels 2434-1, 2434-2. Gas flow from each of the two ends of each channel 2434-1, 2434-2 is split between two halves of respective one-eighth circle channels 2436-1 through 2436-4. Specifically, gas flow from each end of the channel 2434-1 is split between two halves of a respective one of the channels 2436-1 and 2436-2. Similarly, gas flow from each end of the channel 2434-2 is split between two halves of a respective one of channels 2436-3 and 2436-4. Each of the channels 2436-1 through 2436-4 has a pair of ends terminating in respective radial outlet holes 2438, there being a total of eight outlet holes 2438 extending in the radial direction in the illustrated embodiment. Other embodiments may have a different number of outlets. The outer showerhead 2440 is surrounded by the outer manifold 2430 and receives gas flow in the radially inward direction from the manifold 2430 through the radial holes 2438. The outer showerhead 2440 includes a plenum 2442 having a floor 2444 with gas injection holes 2446 extending axially through the floor and providing gas flow into the reactor chamber interior 104.

Figure 16B:
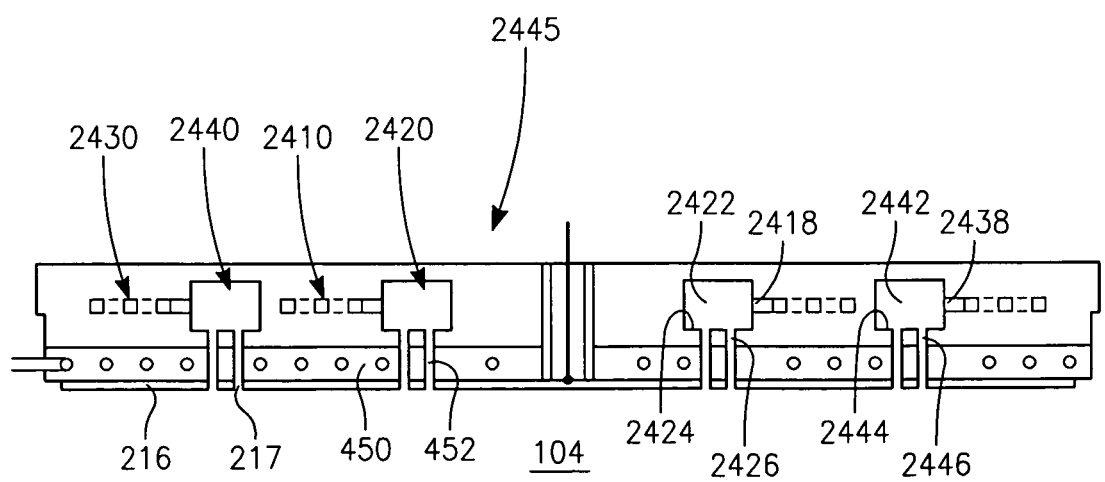
FIG. 16B is a cut-away side view of a related embodiment in which the gas distribution assembly is separated from the ceiling electrode by a temperature control plate.

The inner manifold 2410, the inner showerhead 2420, the outer manifold 2430 and the outer showerhead 2440 are mutually concentric components comprising a gas distribution plate 2445. The electrode 216 underlies the bottom of the plate 2445. The electrode has holes 217 some of which are in registration with the outlet holes 2426 of the inner showerhead 2420 and others of which are in registration with the outlet holes 2446 of the outer showerhead 2440. A temperature control plate 450 may be placed between the gas distribution plate 2445 and the electrode 216 in the manner depicted in FIG. 16B. The temperature control plate 450 has holes 452 in registration with the showerhead outlet holes 2426 and 2446.

In the embodiments of FIGS. 12-16B, gas flow from each of the path splitting manifolds (e.g., the path splitting manifolds 410, 420 of FIG. 12) is in the radial direction so that the respective showerheads (e.g., the showerheads 420, 440 of FIG. 12) are juxtaposed radially or side-by-side with the path splitting manifolds. In the implementations described herein, these embodiments can provide an advantage over the embodiments of FIGS. 1-11, in that the separation between the inner and outer gas injection zones established by the inner and outer showerheads (e.g., the inner and outer showerheads 410, 430 of FIG. 12) is greater, and therefore provides superior resolution between the gas flows of the inner and outer gas injection zones.

Figure 17:
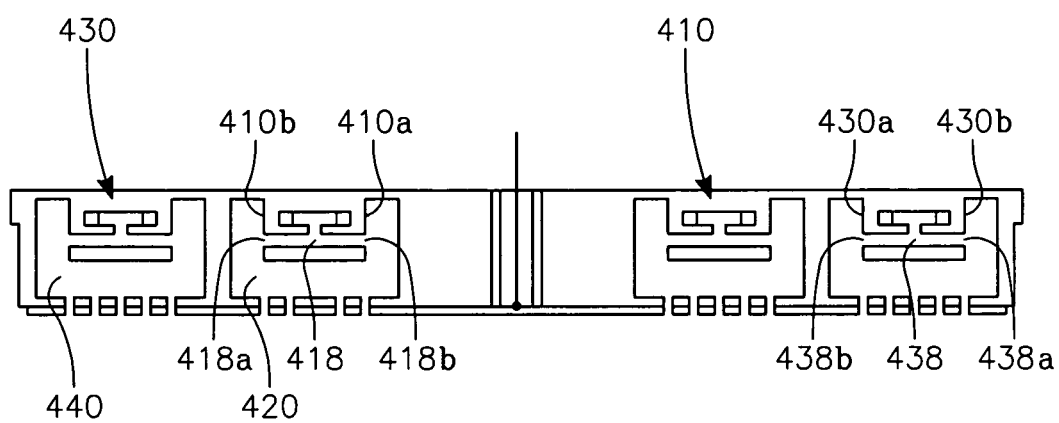
FIG. 17 is a cut-away side view of an embodiment in which each path splitting manifold is immersed within a respective showerhead.

Path Splitting Manifold Immersed Inside Showerhead:

FIG. 17 depicts an embodiment in which each showerhead 420, 440 is enlarged to form a large interior volume, and the respective path-splitting manifold 410, 430 is immersed or contained inside the enlarged interior volume of the showerhead. The manifolds 410, 430 eject gas radially outwardly. However, in another embodiment (not shown), the manifolds 410, 430 may be replaced by the manifolds 2410, 2430, respectively, that eject gas radially inwardly. In the embodiment depicted in FIG. 17, the manifolds 410 and 430 have been modified to eject gas in both the radially inward direction and the radially outward direction.

Figure 18:
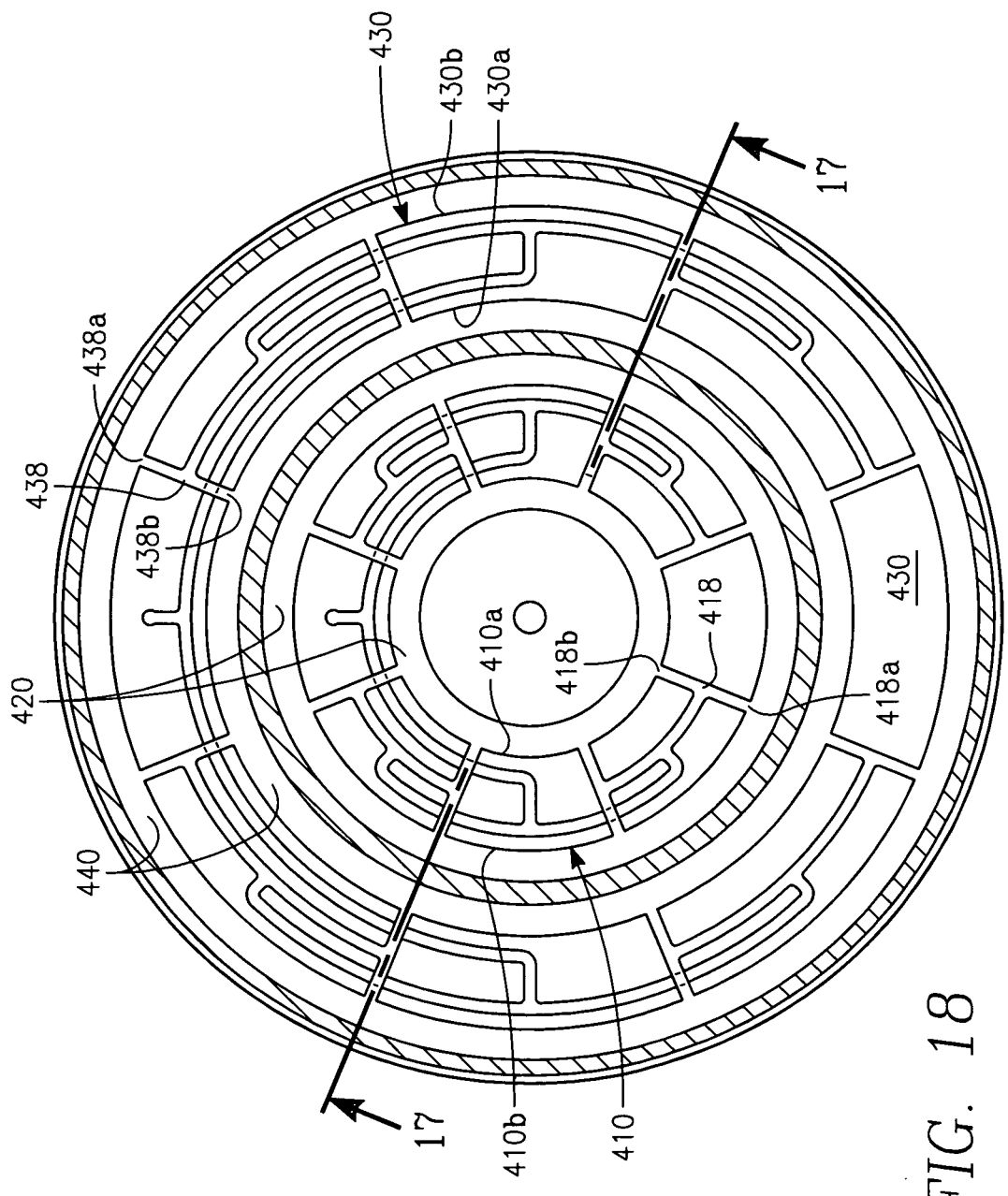
FIG. 18 is a top view of an embodiment of a path splitting manifold having both radially inward facing outlets and radially outward facing outlets, for use in the embodiment of FIG. 17.

FIG. 18 is a plan view of the modification of the inner manifold 410 for use in the embodiment of FIG. 17, in which gas is ejected from the manifold 410 in both the radially outward direction and the radially inward direction. Referring now to both FIGS. 17 and 18, the gas outlet holes 418 extend to both the inner and outer surfaces 410*a*, 410*b* of the manifold 410, so that each hole forms an outwardly facing opening 418*a* and an inwardly facing opening 418*b*. FIG. 18 also depicts the modification of the outer manifold 430 in which gas is ejected from the manifold 430 in both the radially outward direction and the radially inward direction. Referring to both FIGS. 17 and 18, the gas outlet holes 438 extend to both the inner and outer surfaces 430*a*, 430*b* of the manifold 430, so that each hole forms an outwardly facing opening 438*a* and an inwardly facing opening 438*b*.

An advantage of the embodiments of FIGS. 17 and 18 is that there can be greater number of outlet channels in each of the path splitting manifolds (e.g., the path splitting manifolds 410, 430 of FIG. 18) than in other embodiments. Specifically, referring to FIG. 18, the outer path splitting manifold 430 (for example) as both a set of outwardly-facing outlets 438*a* and a set of inwardly-facing outlets 438*b*, and therefore has a significantly larger (e.g., twice) number of gas outlets relative to the embodiment of FIG. 12 (for example). As a result, the embodiment of FIG. 18 can have a proportionately greater gas conductance.

Figure 19:
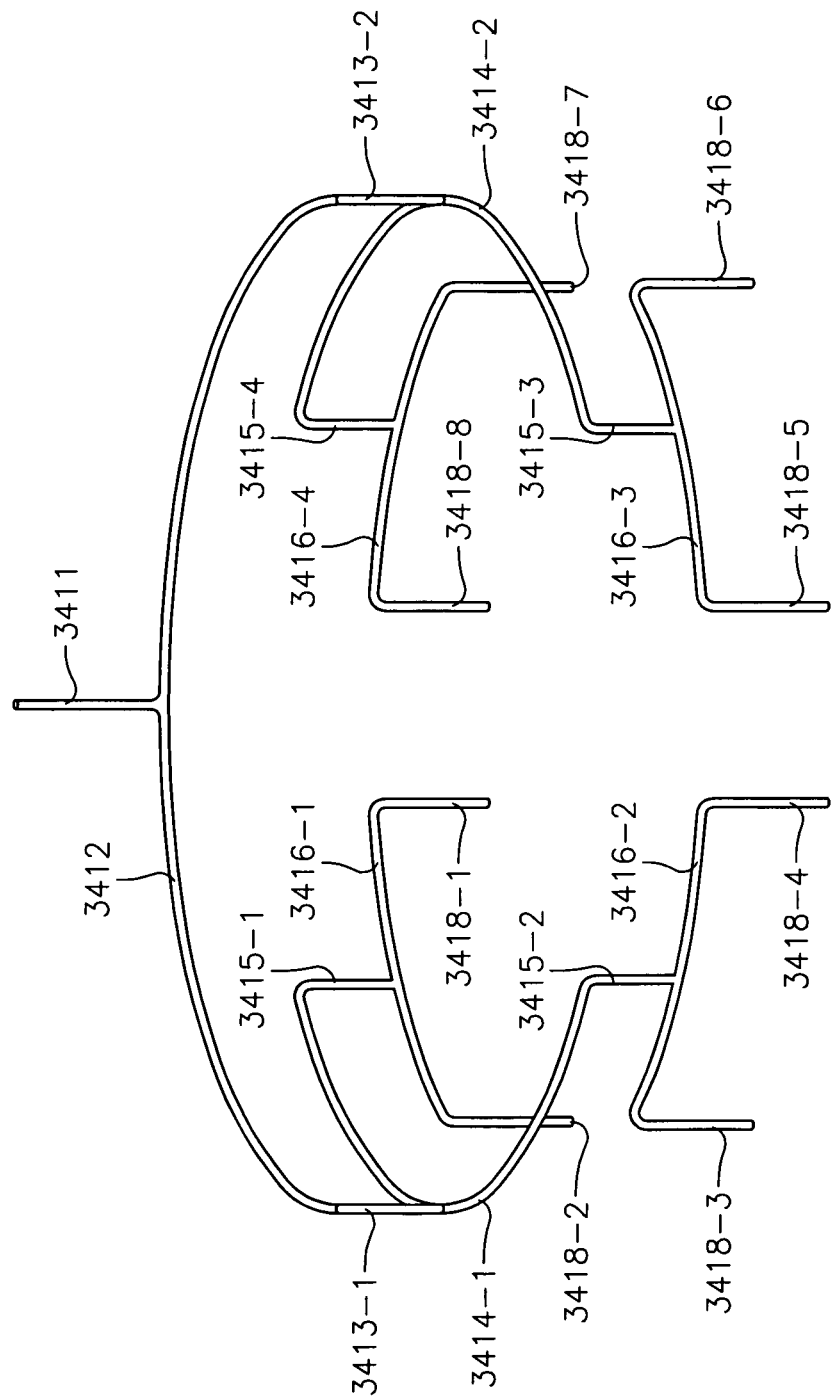
FIG. 19 is a simplified orthographic view of an embodiment in which the path splitting channels of the manifold are vertically stacked.
Figure 20:
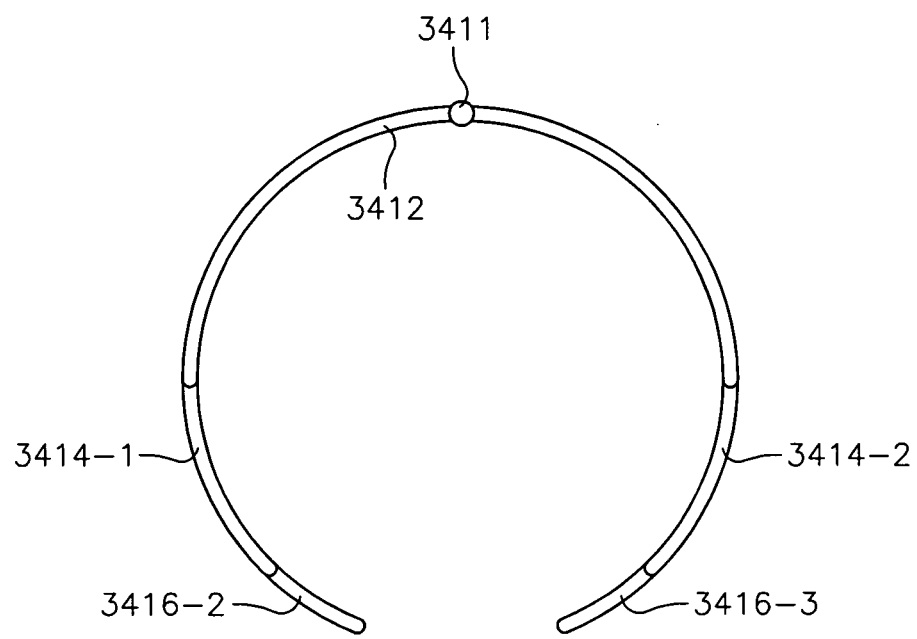
FIG. 20 is a top view corresponding to FIG. 19.

Vertically Stacked Path Splitting Manifold:

The path splitting manifolds of the foregoing embodiments distributed gas flow primarily in the radial direction and primarily in a plane. FIG. 19 depicts an embodiment in which a path splitting manifold is vertically distributed or stacked. The manifold of FIG. 19 has a gas supply inlet 3411 from which gas flow is split between two halves of a half-circle gas flow channel 3412. Quarter circle channels 3414-1 and 3414-2 are axially displaced below the half circle channel, with their midpoints being coupled to respective ends of the half circle channel 3412 by respective axial channels 3413-1 and 3413-2. Gas flow from each of the two ends of the channel 3412 is split between two halves of the respective quarter circle channels 3414-1, 3414-2. One-eighth circle channels 3416-1 through 3416-4 are axially displaced below the quarter circle channels 3414-1, 3414-2, with their midpoints being coupled to respective ends of the quarter circle channels 3414-1 and 3414-2 by respective axial channels 3415-1 through 3415-4. Gas flow from each of the two ends of each channel 3414-1, 3414-2 is split between two halves of the respective one-eighth circle channels 3416-1 through 3416-4. Specifically, gas flow from each end of the channel 3414-1 is split between two halves of a respective one of channels 3416-1 and 3416-2. Similarly, gas flow from each end of the channel 3414-2 is split between two halves of a respective one of channels 3416-3 and 3416-4. Each of the channels 3416-1 through 3416-4 has a pair of ends terminating in respective outlets 3418-1 through 3418-8, there being a total of eight outlets 3418-1 through 3418-8 in the illustrated embodiment. Other embodiments may have a different number of outlets. The outlets 3418 are depicted as extending in the axial direction, for coupling to a showerhead that is axially below the manifold. However, in other embodiments these outlets may extend in a direction other that axial. FIG. 20 is a plan view corresponding to FIG. 19 and showing how the gas flow channels of FIG. 19 may be confined to a narrow cylindrical annulus.

Figure 21:
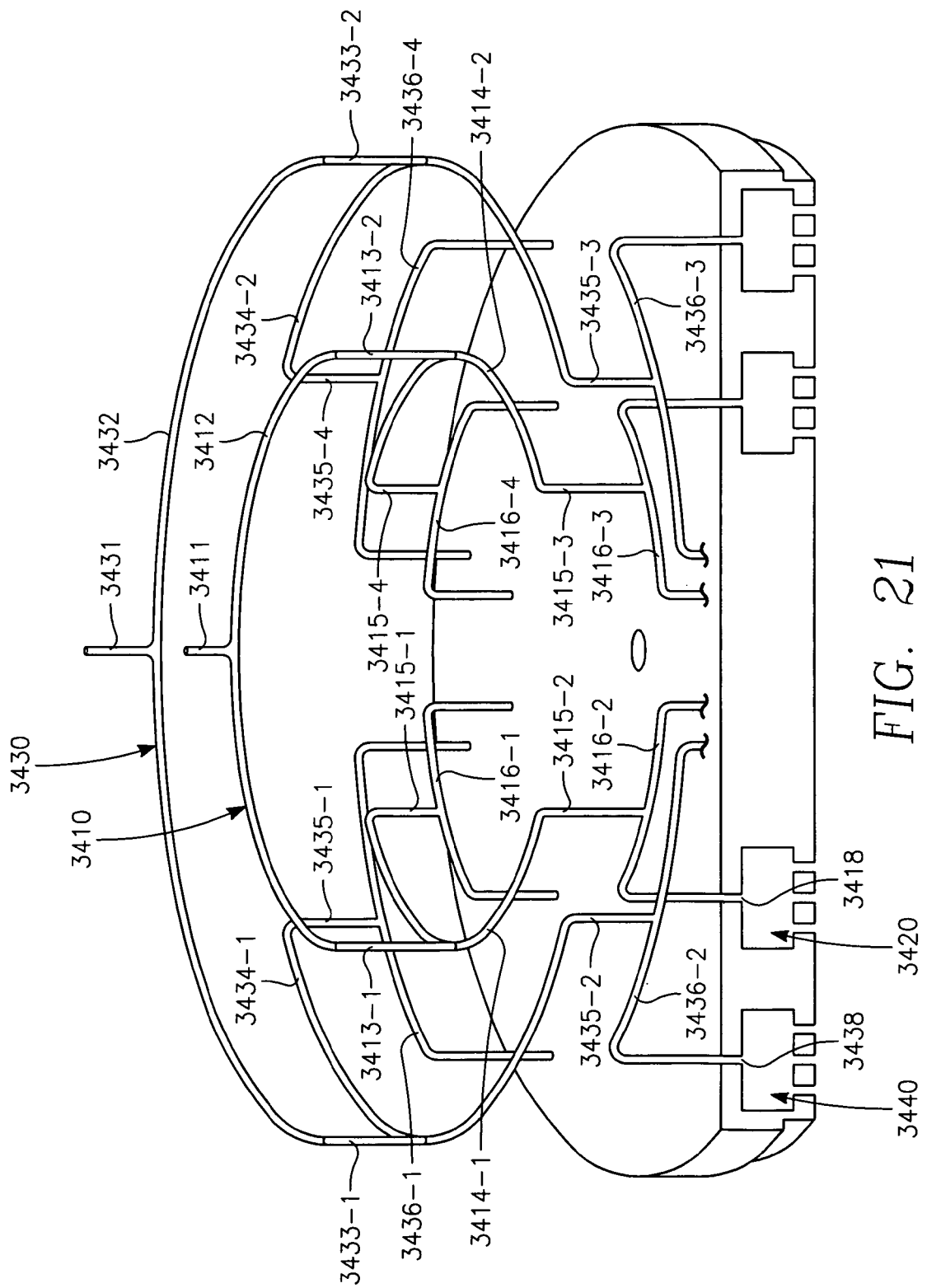
FIG. 21 is a side view illustrating an embodiment having inner and outer manifolds with vertically stacked path splitting channels.
Figure 22:
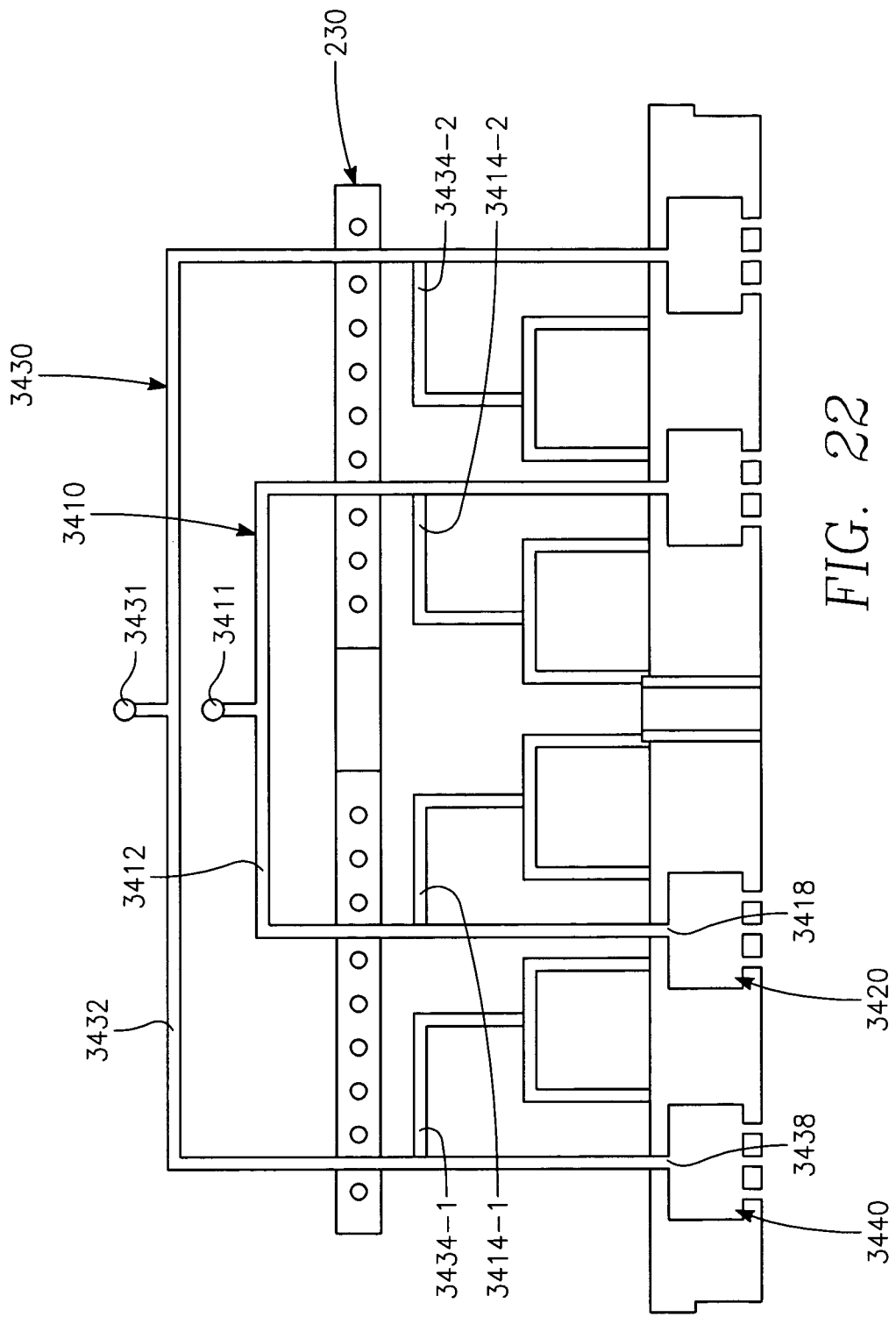
FIG. 22 is a top view corresponding to FIG. 21.

FIGS. 21 and 22 depict a gas distribution system having inner and outer vertically stacked manifolds and inner and outer showerheads. The gas distribution system includes an inner manifold 3410 axially above an inner showerhead 3420 and an outer manifold 3430 axially displaced above an outer showerhead 3440.

The inner manifold 3410 of FIG. 21 has a gas supply inlet 3411 from which gas flow is split between two halves of a half-circle gas flow channel 3412. Quarter circle channels 3414-1 and 3414-2 are axially displaced below the half circle channel, with their midpoints being coupled to respective ends of the half circle channel 3412 by respective axial channels 3413-1 and 3413-2. Gas flow from each of the two ends of the channel 3412 is split between two halves of the respective quarter circle channels 3414-1, 3414-2. One-eighth circle channels 3416-1 through 3416-4 are axially displaced below the quarter circle channels 3414-1, 3414-2, with their midpoints being coupled to respective ends of the quarter circle channels 3414-1 and 3414-2 by respective axial channels 3415-1 through 3415-4. Gas flow from each of the two ends of each channel 3414-1, 3414-2 is split between two halves of the respective one-eighth circle channels 3416-1 through 3416-4. Specifically, gas flow from each end of the channel 3414-1 is split between two halves of a respective one of channels 3416-1 and 3416-2. Similarly, gas flow from each end of the channel 3414-2 is split between two halves of a respective one of channels 3416-3 and 3416-4. Each of the channels 3416-1 through 3416-4 has a pair of ends terminating in respective outlets 3418-1 through 3418-8, there being a total of eight outlets 3418-1 through 3418-8 extending axially to the underlying inner showerhead 3420 in the illustrated embodiment. Other embodiments may have a different number of outlets.

While the channel 3412 is described above as a half circle, the channels 3414-1 and 3414-2 are described as being quarter circles and the channels 3416-1 through 3416-4 are described as being one-eighth circles, these channels may be of any suitable lengths, provided gas flow into each channel enters at the midpoint along the length of the channel. This ensures equal path lengths from the main inlet 3411 to each of the outlets 3418.

The outer manifold 3430 of FIG. 21 has a gas supply inlet 3431 from which gas flow is split between two halves of a half-circle gas flow channel 3432. Quarter circle channels 3434-1 and 3434-2 are axially displaced below the half circle channel, with their midpoints being coupled to respective ends of the half circle channel 3432 by respective axial channels 3433-1 and 3433-2. Gas flow from each of the two ends of the channel 3432 is split between two halves of the respective quarter circle channels 3434-1, 3434-2. One-eighth circle channels 3436-1 through 3436-4 are axially displaced below the quarter circle channels 3434-1, 3434-2, with their midpoints being coupled to respective ends of the quarter circle channels 3434-1 and 3434-2 by respective axial channels 3435-1 through 3435-4. Gas flow from each of the two ends of each channel 3434-1, 3434-2 is split between two halves of the respective one-eighth circle channels 3436-1 through 3436-4. Specifically, gas flow from each end of the channel 3434-1 is split between two halves of a respective one of channels 3436-1 and 3436-2. Similarly, gas flow from each end of the channel 3434-2 is split between two halves of a respective one of channels 3436-3 and 3436-4. Each of the channels 3436-1 through 3436-4 has a pair of ends terminating in respective outlets 3438-1 through 3438-8, there being a total of eight outlets in the illustrated embodiment. Other embodiments may have a different number of outlets. The outlets 3438-1 through 3438-8 extend in the axial direction to the underlying outer showerhead 3440.

While the channel 3432 is described above as a half circle, the channels 3434-1 and 3434-2 are described as being quarter circles and the channels 3436-1 through 3436-4 are described as being one-eighth circles, these channels may be of any suitable lengths, provided gas flow into each channel enters at the midpoint along the length of the channel. This ensures equal path lengths from the main inlet 3431 to each of the outlets 3438-1 through 3438-8.

FIG. 22 illustrates a temperature control plate 230 may be interposed between the different axial layers of the manifolds 3410, 3430. For example, the temperature control 230 plate may be placed axially between the layer consisting of the half circle channels 3412 and 3432 and the layer consisting of the quarter circle channels 3414-1, 3414-2 and 3434-1 and 3434-2.

Figure 23:
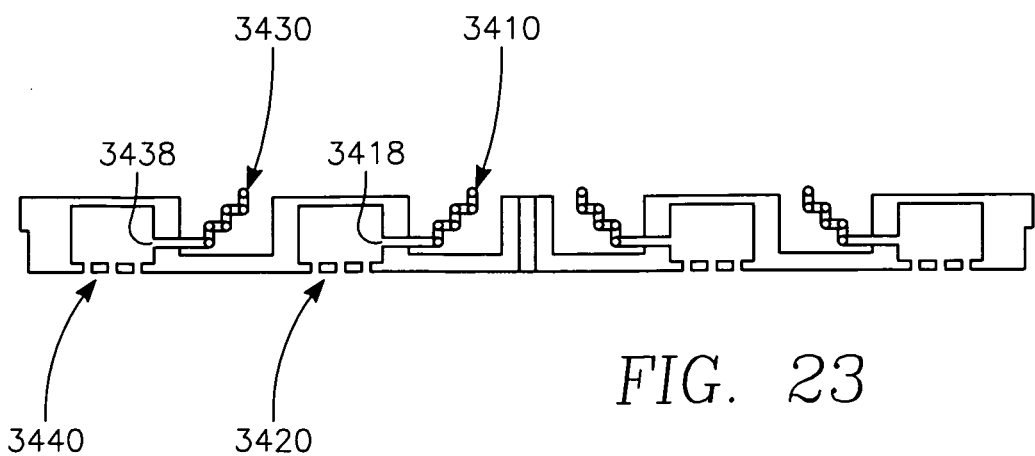
FIG. 23 is a side view of a modification of the embodiment of FIG. 19 in which the vertically stacked path splitting manifold and the showerhead are side-by-side.

FIG. 23 illustrates a further embodiment, in which the vertically stacked path splitting manifold 3410 and the showerhead 3420 are at least partially side-by-side, and the outlets 3418 are oriented in the radial direction. Also in FIG. 23, the vertically stacked path splitting manifold 3430 and the showerhead 3440 are at least partially side-by-side and the outlets 3438 are oriented in radial directions.

Hierarchy of Recursively Split Channels:

The path-splitting channels of the embodiments of FIGS. 3A, 9A, 12, 15 and 18 are distributed in azimuthally extending planes. The path-splitting channels of the embodiments of FIGS. 19 and 21 are axially distributed. These embodiments each consist of successive layers of split channels, in which the gas flow paths are recursively (repeatedly) split, each layer having twice as many channels as the previous layer. For example, in the embodiment of FIG. 9A, the input channel 1214 is split between two halves of the channel 1212-1, which in turn is split into two halves of channels 1212-2, which in turn are split into four pairs of halves of channels 1212-3, which in turn is split into eight pairs of halves of channels 1212-4. In this example, there are a total of four levels of parallel splits, there being a single split in the first layer and eight splits in the fourth layer, for a total of sixteen outputs. This multiplication of the number of outputs may be referred to as recursive splitting or recursive connection at the midpoints of successive channels. The number of outputs N is determined by the number of levels of splits, n. In the foregoing example, n=4, and the general rule is $N=2^n$. The recursive nature of this structure can be implemented for any integer value of n, although the various embodiments described above have values of n=3 (e.g., FIG. 19) and n=4 (FIG. 9A). Each of these embodiments constitutes a hierarchy of channels recursively coupled at their midpoints to outputs of other channels of the hierarchy.

While the foregoing is directed to embodiments of the invention, other and further embodiments of the invention may be devised without departing from the basic scope thereof, and the scope thereof is determined by the claims that follow.

What is claimed is:

1. A gas distribution showerhead assembly for use in a plasma reactor, comprising:
   a gas supply lid having a bottom surface, and inner and outer gas supply ports in said bottom surface;
   a manifold plate having top and bottom manifold surfaces, said top manifold surface facing the bottom surface of said gas supply lid;
   a showerhead plate facing said bottom manifold surface and comprising inner and outer zones, each of said zones comprising an array of plural gas injection orifices extending through said showerhead plate and distributed along both a radial direction and an azimuthal direction;
   inner and outer gas distribution manifolds, said inner gas distribution manifold comprising:
      (a) plural inner manifold orifices extending through said manifold plate and distributed along an inner radial location;
      (b) plural top surface inner channels in said top manifold surface and defining plural top paths of generally equal lengths between said inner gas supply port and respective ones of said inner manifold orifices;
      (c) plural bottom surface inner channels formed in said bottom manifold surface and defining plural bottom paths of generally equal lengths between respective ones of said inner manifold orifices and respective ones of the plural gas injection orifices of said inner zone.

2. The apparatus of claim 1 wherein said outer gas distribution manifold comprises:
   (a) plural outer manifold orifices extending through said manifold plate and located along an outer radial location;
   (b) plural top surface outer channels in said top manifold surface and defining plural top paths between said outer gas supply port and respective ones of said outer manifold orifices;
   (c) plural bottom surface outer channels formed in said bottom manifold surface and defining plural bottom paths of generally equal lengths between respective ones of said outer manifold orifices and respective ones of the plural gas injection orifices of said outer zone.

3. The apparatus of claim 2 wherein said plural top surface outer channels constitute a hierarchy of channels recursively coupled at their midpoints to outputs of other channels of said hierarchy.

4. The apparatus of claim 3 wherein said plural bottom surface outer channels comprise plural arcuate bottom surface outer channels at respective radial locations and plural radial bottom surface outer channels extending between respective ones of said arcuate bottom surface outer channels, each of said radial bottom surface outer channels having a midpoint in registration with a respective one of said outer manifold orifices.

5. The apparatus of claim 4 wherein said arcuate bottom surface channels are terminated at respective zones in registration with respective ones of said plural gas injection orifices of said outer zone.

6. The apparatus of claim 5 wherein said plural arcuate bottom surface channels comprise four sections of said arcuate bottom surface channels, each of said bottom surface channels extending one quarter of an arc circle between corresponding pairs of said respective zones.

7. The apparatus of claim 2 wherein said top surface outer channels provide gas distribution in an azimuthal direction and said bottom surface outer channels provide gas distribution in both radial and azimuthal directions.

8. The apparatus of claim 7 wherein said plural bottom paths between respective ones of said outer manifold orifices and respective ones of the plural gas injection orifices of said outer zone are of generally equal lengths.

9. The apparatus of claim 1 wherein said plural top surface inner channels constitute a hierarchy of channels recursively coupled at their midpoints to outputs of other channels of said hierarchy.

10. The apparatus of claim 9 wherein said plural bottom surface inner channels comprise plural arcuate bottom surface inner channels at respective radial locations and plural radial bottom surface inner channels extending between respective ones of said arcuate bottom surface inner channels, each of said radial bottom surface inner channels having a midpoint in registration with a respective one of said inner manifold orifices.

11. The apparatus of claim 10 wherein said arcuate bottom surface channels are terminated at respective zones in registration with respective ones of said plural gas injection orifices of said inner zone.

12. The apparatus of claim 11 wherein said plural arcuate bottom surface channels comprise four sections of said arcuate bottom surface channels, each of said arcuate bottom surface channels extending one quarter of an arc circle between corresponding pairs of said respective zones.

13. The apparatus of claim 1 wherein said top surface inner channels provide gas distribution in an azimuthal direction and said bottom surface inner channels provide gas distribution in both radial and azimuthal directions.

14. The apparatus of claim 1 wherein the number of said plural gas injection orifices of said inner zone of said showerhead plate exceeds the number of said inner manifold orifices.

* * * * *